(12) United States Patent
Cho et al.

(10) Patent No.: US 9,200,117 B2
(45) Date of Patent: Dec. 1, 2015

(54) POLY(AMIDE-IMIDE) BLOCK COPOLYMER, ARTICLE INCLUDING SAME, AND DISPLAY DEVICE INCLUDING THE ARTICLE

(75) Inventors: Chung Kun Cho, Suwon-si (KR); Kalinina Fedosya, Suwon-si (KR); Kovalev Mikhail, Suwon-si (KR); Androsov Dmitry, Suwon-si (KR); Won-Cheol Jung, Seoul (KR); Yoon Seok Ko, Seoul (KR)

(73) Assignee: SAMSUNG ELECTRONICS CO., LTD. (KR)

( * ) Notice: Subject to any disclaimer, the term of this patent is extended or adjusted under 35 U.S.C. 154(b) by 0 days.

(21) Appl. No.: 13/474,401

(22) Filed: May 17, 2012

(65) Prior Publication Data

US 2012/0296050 A1 Nov. 22, 2012

(30) Foreign Application Priority Data

May 18, 2011 (KR) ........................ 10-2011-0046837

(51) Int. Cl.
| | | |
|---|---|---|
| *C08G 73/10* | (2006.01) | |
| *B32B 15/00* | (2006.01) | |
| *C08G 73/14* | (2006.01) | |
| *C08L 79/08* | (2006.01) | |
| *C09D 179/08* | (2006.01) | |
| *C09J 179/08* | (2006.01) | |
| *H01L 51/00* | (2006.01) | |

(52) U.S. Cl.
CPC .............. *C08G 73/14* (2013.01); *C08L 79/08* (2013.01); *C09D 179/08* (2013.01); *C09J 179/08* (2013.01); *H01L 51/0097* (2013.01); *Y02E 10/549* (2013.01)

(58) Field of Classification Search
None
See application file for complete search history.

(56) References Cited

U.S. PATENT DOCUMENTS

| | | | |
|---|---|---|---|
| 4,124,651 A | 11/1978 | Lohmann et al. | |
| 5,232,472 A | 8/1993 | Simmons et al. | |
| 7,364,799 B2 | 4/2008 | Kurita et al. | |
| 7,728,102 B2 | 6/2010 | Kurita et al. | |
| 8,153,753 B2 | 4/2012 | Moriyama et al. | |
| 2005/0165209 A1 | 7/2005 | Kurita et al. | |
| 2006/0106193 A1 | 5/2006 | Moriyama et al. | |
| 2006/0201664 A1 | 9/2006 | Yamasaki | |
| 2006/0235169 A1 | 10/2006 | Yamasaki | |
| 2006/0293498 A1 | 12/2006 | Kurita et al. | |
| 2007/0126966 A1 | 6/2007 | Takahashi | |
| 2010/0018756 A1* | 1/2010 | Shimeno et al. | 174/254 |
| 2010/0123142 A1 | 5/2010 | Ryu et al. | |
| 2010/0255619 A1 | 10/2010 | Kwon et al. | |

FOREIGN PATENT DOCUMENTS

| | | |
|---|---|---|
| CA | 1033869 A1 | 7/1973 |
| CA | 2008859 A1 | 8/1990 |
| DE | 4332248 A1 | 3/1994 |
| EP | 0315025 A1 | 5/1989 |

(Continued)

OTHER PUBLICATIONS

Vora, R.H., Designing of molecular architecture, synthesis and properties of the next generation of state-of-the-art high-performance thermoplastic fluoro-poly(etheramide)s, (6F-PEA), fluoro-poly(ether amide-imide)s (6F-PEAI), and their co-polymers, Materials Science and Engineering: B, 2010, vol. 168: (1-3): 71-84.

(Continued)

*Primary Examiner* — Ana Woodward
(74) *Attorney, Agent, or Firm* — Cantor Colburn LLP

(57) ABSTRACT

A poly(amide-imide) block copolymer that includes: a first segment including a repeating unit represented by Chemical Formula 1A, a repeating unit represented by Chemical Formula 1B, a repeating unit represented by Chemical Formula 1C, or a combination thereof; and a second segment including a repeating unit represented by Chemical Formula 2:

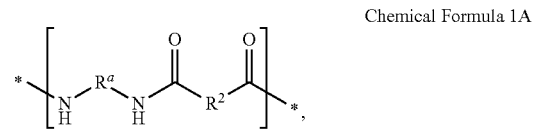

Chemical Formula 1A

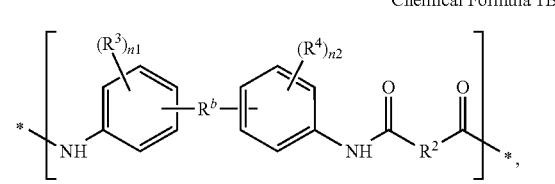

Chemical Formula 1B

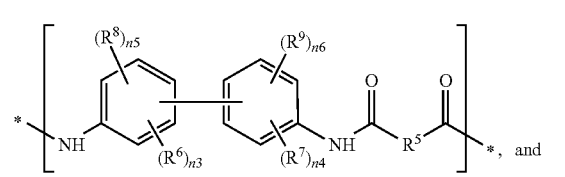

Chemical Formula 1C

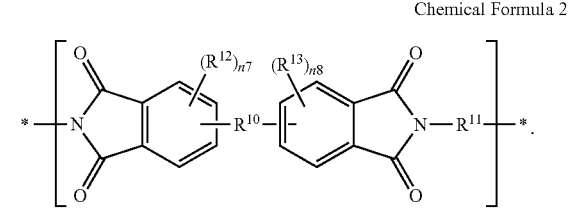

Chemical Formula 2

29 Claims, 2 Drawing Sheets

(56) References Cited

FOREIGN PATENT DOCUMENTS

| | | |
|---|---|---|
| EP | 0381621 A2 | 8/1990 |
| EP | 1775316 A1 | 4/2007 |
| GB | 1440471 A | 6/1976 |
| JP | 4960399 A | 6/1974 |
| JP | 5757718 A | 4/1982 |
| JP | 4227635 A | 8/1992 |
| JP | 08-143666 A | 6/1996 |
| JP | 2003306560 A | 10/2003 |
| JP | 2007-204714 A | 8/2007 |
| KR | 1020040094730 A | 11/2004 |
| KR | 1020050067217 A | 6/2005 |
| KR | 1020070042233 A | 4/2007 |
| KR | 10-0808044 B1 | 3/2008 |
| KR | 1020100110125 A | 10/2010 |
| KR | 1020100115994 A | 10/2010 |
| KR | 10-1022650 B1 | 3/2011 |

OTHER PUBLICATIONS

Extended European Search Report for corresponding European Application No. 12168421.1-2115, dated Dec. 3, 2012, 5 pages.

The Examination for European Patent Application No. 12168421.1 dated Nov. 6, 2013.

Office Action dated Oct. 6, 2015, of the corresponding Japanese Patent Application No. 2012-114609.

\* cited by examiner

POLY(AMIDE-IMIDE) BLOCK COPOLYMER, ARTICLE INCLUDING SAME, AND DISPLAY DEVICE INCLUDING THE ARTICLE

CROSS-REFERENCE TO RELATED APPLICATION

This application claims priority to Korean Patent Application No. 10-2011-0046837, filed on May 18, 2011, and all the benefits accruing therefrom under 35 U.S.C. §119, the content of which in its entirety is herein incorporated by reference.

BACKGROUND

1. Field

This disclosure relates to a poly(amide-imide) block copolymer, an article including the same, and a display device including the article.

2. Description of the Related Art

Colorless transparent materials have been developed for a diverse range of applications, such as for an optical lens, a functional optical film, and a disk substrate. However, as information devices are further miniaturized and display devices provide higher resolution, more functions and greater performance are required from the transparent materials.

Therefore, there remains a need for a colorless transparent material having improved properties, such as improved transparency, heat resistance, mechanical strength, or flexibility.

SUMMARY

An exemplary embodiment provides a poly(amide-imide) block copolymer having excellent transparency, heat resistance, mechanical strength, and flexibility.

Another embodiment provides an article including the poly (amide-imide) block copolymer.

Yet another embodiment provides a display device including the article.

Still another embodiment provides a method for preparing a poly(amide-imide) block copolymer.

Still yet another embodiment provides a method for preparing an article including the poly(amide-imide) block copolymer.

According to an embodiment, a poly(amide-imide) block copolymer is provided that includes: a first segment including a repeating unit represented by the following Chemical Formula 1A, a repeating unit represented by the following Chemical Formula 1B, a repeating unit represented by the following Chemical Formula 1C, or a combination thereof; and a second segment including a repeating unit represented by the following Chemical Formula 2.

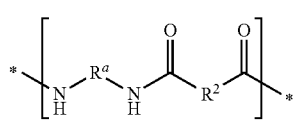

Chemical Formula 1A

In Chemical Formula 1A, $R^a$ is the same or different in each repeating unit and each is independently a substituted or unsubstituted C3 to C30 aliphatic organic group, or a substituted or unsubstituted C13 to C20 fluorenylene group, and $R^2$ is the same or different in each repeating unit and each is independently a substituted or unsubstituted C6 to C30 aromatic organic group.

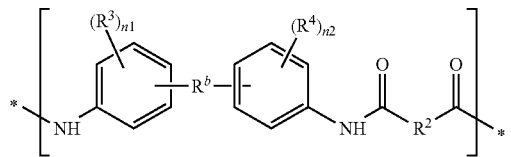

Chemical Formula 1B

In Chemical Formula 1B, $R^b$ is the same or different in each repeating unit and each is independently a single bond, a substituted or unsubstituted C3 to C30 aliphatic organic group, a substituted or unsubstituted C3 to C30 alicyclic organic group, a substituted or unsubstituted C6 to C30 aromatic organic group, a substituted or unsubstituted C2 to C30 heterocyclic group, or a substituted or unsubstituted C13 to C20 fluorenylene group, —O—, —S—, —S(=O)$_2$—, or —C(=O)—, $R^2$ is as defined above, $R^3$ and $R^4$ are the same or different and are each independently hydrogen, a halogen, a hydroxyl group, an ether group of the formula —OR$^{200}$ wherein R$^{200}$ is a C1 to C10 aliphatic organic group, a silyl group of the formula —SiR$^{201}$R$^{202}$R$^{203}$ wherein R$^{201}$, R$^{202}$, and R$^{203}$ are the same or different and are each independently hydrogen or a C1 to C10 aliphatic organic group, a substituted or unsubstituted C1 to C10 aliphatic organic group, or a C6 to C20 aromatic organic group, and n1 and n2 are each independently an integer ranging from 0 to 4.

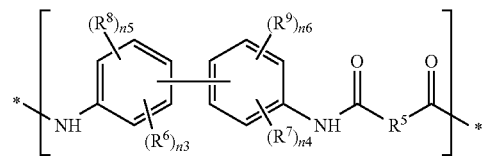

Chemical Formula 1C

In Chemical Formula 1C, $R^5$ is the same or different in each repeating unit and each is independently a substituted or unsubstituted C6 to C30 aromatic organic group, $R^6$ and $R^7$ are the same or different and are each independently an electron withdrawing group, $R^8$ and $R^9$ are the same or different and are each independently hydrogen, a halogen, a hydroxyl group, an ether group of the formula —OR$^{204}$ wherein R$^{204}$ is a C1 to C10 aliphatic organic group, a silyl group of the formula —SiR$^{205}$R$^{206}$R$^{207}$ wherein R$^{205}$, R$^{206}$, and R$^{207}$ are the same or different and are each independently hydrogen or a C1 to C10 aliphatic organic group, a substituted or unsubstituted C1 to C10 aliphatic organic group, or a C6 to C20 aromatic organic group, n3 is an integer ranging from 1 to 4, n5 is an integer ranging from 0 to 4, a sum of n3+n5 is an integer ranging from 1 to 4, n4 is an integer ranging from 1 to 4, n6 is an integer ranging from 0 to 4, and a sum of n4+n6 is an integer ranging from 1 to 4.

Chemical Formula 2

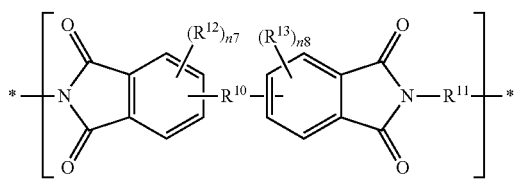

In Chemical Formula 2, $R^{10}$ is the same or different in each repeating unit and each is independently a single bond, a substituted or unsubstituted C1 to C30 aliphatic organic group, a substituted or unsubstituted C3 to C30 alicyclic organic group, a substituted or unsubstituted C6 to C30 aromatic organic group, or a substituted or unsubstituted C2 to C30 heterocyclic group, —O—, —S—, —S(=O)$_2$—, or —C(=O)—, $R^{11}$ is the same or different in each repeating unit and each independently includes a substituted or unsubstituted C3 to C30 aliphatic organic group, a substituted or unsubstituted C3 to C30 alicyclic organic group, a substituted or unsubstituted C6 to C30 aromatic organic group wherein the aromatic organic group is present singularly or at least two are linked to provide a condensed cycle or at least two are linked by a single bond, a substituted or unsubstituted C13 to C20 fluorenylene group, —O—, —S—, —C(=O)—, —CH(OH)—, —S(=O)$_2$—, —Si(CH$_3$)$_2$—, —(CH$_2$)$_p$— wherein 1≤p≤10, —(CF$_2$)$_q$— wherein 1≤q≤10, —C(CH$_3$)$_2$—, —C(CF$_3$)$_2$—, or —C(=O)NH—, $R^{12}$ and $R^{13}$ are the same or different and are each independently hydrogen, a halogen, a hydroxyl group, an ether group of the formula —OR$^{208}$ wherein R$^{208}$ is a C1 to C10 aliphatic organic group, a silyl group of the formula —SiR$^{209}$R$^{210}$R$^{211}$ wherein R$^{209}$, R$^{210}$, and R$^{211}$ are the same or different and are each independently hydrogen or a C1 to C10 aliphatic organic group, a substituted or unsubstituted C1 to C10 aliphatic organic group, a substituted or unsubstituted C3 to C30 alicyclic organic group, or a C6 to C20 aromatic organic group, and n7 and n8 are each independently integers ranging from 0 to 3.

Particularly, $R^b$ may be:

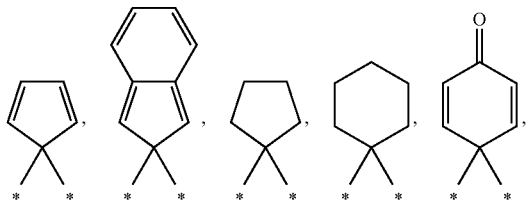

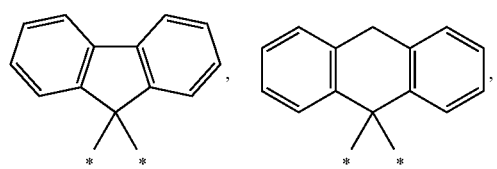

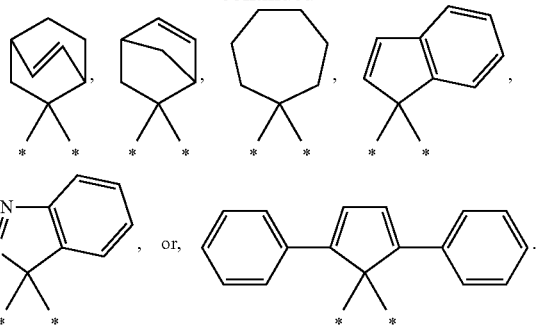

Particularly, $R^6$ and $R^7$ are the same or different and are each independently —CF$_3$, —CCl$_3$, —CBr$_3$, —Cl$_3$, —F, —Cl, —Br, —I, —NO$_2$, —CN, —COCH$_3$, or —CO$_2$C$_2$H$_5$.

Particularly, $R^2$ and $R^5$ are the same or different and are each independently:

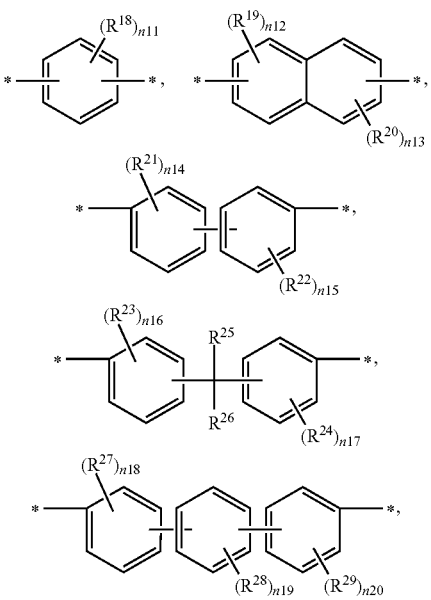

wherein is the above chemical formulas, $R^{18}$ to $R^{29}$ are the same or different and are each independently hydrogen, deuterium, a halogen, a substituted or unsubstituted C1 to C10 aliphatic organic group, a substituted or unsubstituted C6 to C20 aromatic organic group, or a C1 to C2 haloalkyl group, n11 and n14 to n20 are each independently integers ranging from 0 to 4, and n12 and n13 are each independently an integer ranging from 0 to 3.

More particularly, $R^2$ and $R^5$ are the same or different and are each independently:

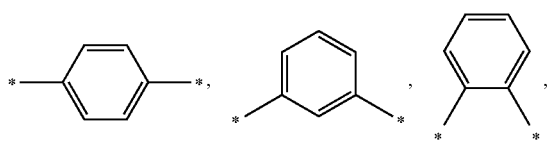

-continued

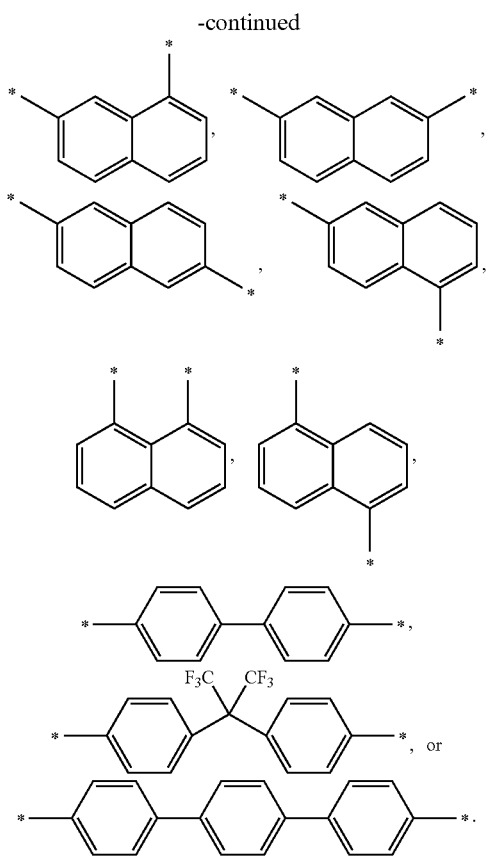

In an embodiment, the poly(amide-imide) block copolymer, the first segments are the same or different and each independently includes about 1 to about 1000 repeating units of the repeating unit represented by Chemical Formula 1A, the repeating unit represented by Chemical Formula 1B, the repeating unit represented by Chemical Formula 1C, or a combination thereof.

The first segment may have a weight average molecular weight of about 500 g/mol to about 50,000 g/mol.

The first segment may further include a repeating unit represented by the following Chemical Formula 4.

Chemical Formula 4

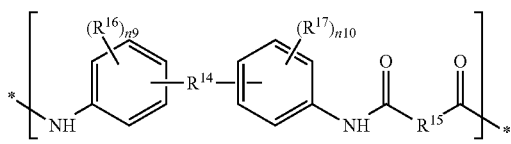

In Chemical Formula 4,
$R^{14}$ is the same or different in each repeating unit and each independently includes —O—, —S—, —C(=O)—, —CH(OH)—, —S(=O)$_2$—, —Si(CH$_3$)$_2$—, —(CH$_2$)$_p$— wherein 1≤p≤10, —(CF$_2$)$_q$— wherein 1≤q≤10, —C(CH$_3$)$_2$—, —C(CF$_3$)$_2$—, —C(=O)NH—, a substituted or unsubstituted C3 to C30 alicyclic organic group, a substituted or unsubstituted C13 to C20 fluorenylene group, or a substituted or unsubstituted C6 to C30 aromatic organic group wherein the aromatic organic group is present singularly or at least two are linked to provide a condensed cycle or at least two are linked by a single bond, a fluorenylene group, —O—, —S—, —C(=O)—, —CH(OH)—, —S(=O)$_2$—, —Si(CH$_3$)$_2$—, —(CH$_2$)$_p$— wherein 1≤p≤10, —(CF$_2$)$_q$— wherein 1≤q≤10, —C(CH$_3$)$_2$—, —C(CF$_3$)$_2$—, or —C(=O)NH—, $R^{15}$ is the same or different in each repeating unit and each is independently a substituted or unsubstituted C6 to C30 aromatic organic group, $R^{16}$ and $R^{17}$ are the same or different and are each independently hydrogen, a halogen, a hydroxyl group, an ether group of the formula —OR$^{212}$ wherein $R^{212}$ is a C1 to C10 aliphatic organic group, a silyl group of the formula —SiR$^{213}$R$^{214}$R$^{215}$ wherein $R^{213}$, $R^{214}$, and $R^{215}$ are the same or different and are each independently hydrogen or a C1 to C10 aliphatic organic group, a substituted or unsubstituted C1 to C10 aliphatic organic group, or a C6 to C20 aromatic organic group, and n9 and n10 may each independently be integers ranging from about 0 to about 4.

In an embodiment, the poly(amide-imide) block copolymer includes about 1 to about 1000 repeating units of the repeating unit represented by Chemical Formula 2.

The second segment may have a weight average molecular weight of about 500 g/mol to about 50,000 g/mol.

In the poly(amide-imide) block copolymer, a total amount of a repeating unit in the first segment and a total amount of a repeating unit in the second segment may be present at a mole ratio of about 95:5 to about 5:95.

Particularly, in the poly(amide-imide) block copolymer, the repeating unit represented by Chemical Formula 2 may include a repeating unit represented by the following Chemical Formula 5.

Chemical Formula 5

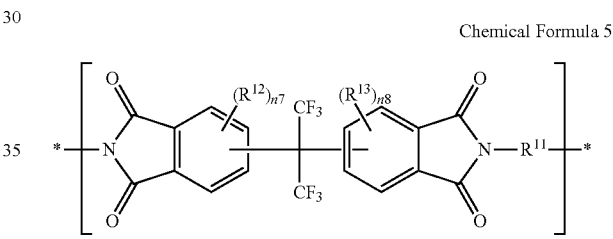

In Chemical Formula 5, $R^{11}$, $R_{12}$, $R^{13}$, n7, and n8 may be the same as defined in Chemical Formula 2. In an embodiment, a mole ratio of total moles of the first segment to total moles of the second segment may be about 95:5 to about 5:95.

Particularly, in the poly(amide-imide) block copolymer, the repeating unit represented by Chemical Formula 2 may include a repeating unit represented by the following Chemical Formula 6:

Chemical Formula 6

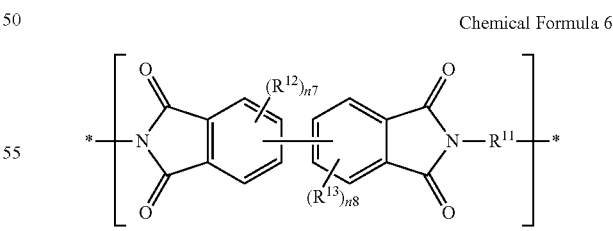

In Chemical Formula 6, $R^{11}$, $R^{12}$, $R^{13}$, n7, and n8 may be the same as defined in Chemical Formula 2. In an embodiment, a mole ratio of total moles of the first segment to total moles of the second segment is about 95:5 to about 5:95.

Particularly, in the poly(amide-imide) block copolymer, the repeating unit represented by Chemical Formula 2 may include repeating units represented by Chemical Formulas 5 and 6.

The repeating units represented by Chemical Formulas 5 and 6 may be present at a mole ratio of about 99:1 to about 1:99.

The first segment and the second segment may be present at a mole ratio of about 95:5 to about 5:95.

Particularly, the repeating unit represented by Chemical Formula 1B may include repeating units represented by the following Chemical Formulas 7 to 9, the repeating unit represented by Chemical Formula 1C may include repeating units represented by the following Chemical Formulas 10 to 12, the repeating unit represented by Chemical Formula 2 may include repeating units represented by the following Chemical Formulas 13 and 14, and the repeating unit represented by Chemical Formula 4 may include repeating units represented by the following Chemical Formulas 15 to 17.

Chemical Formula 7

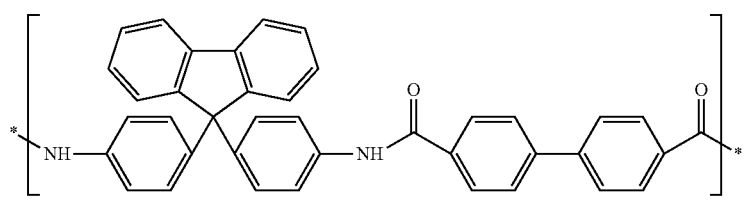

Chemical Formula 8

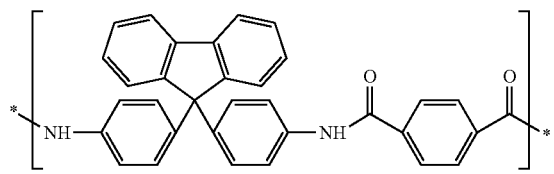

Chemical Formula 9

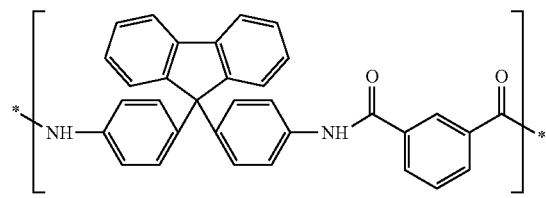

Chemical Formula 10

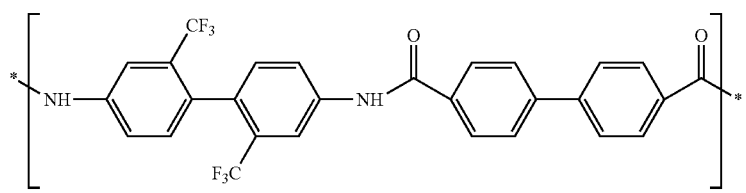

Chemical Formula 11

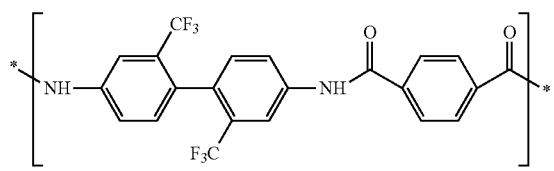

Chemical Formula 12

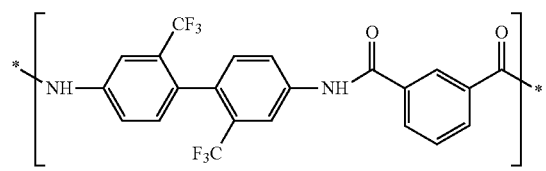

Chemical Formula 13

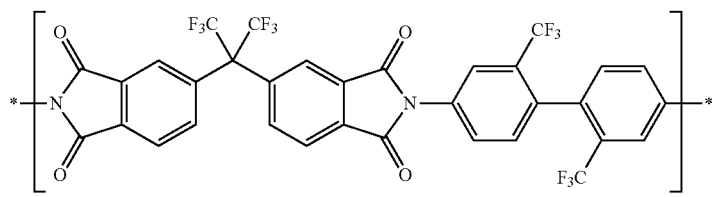

Chemical Formula 14

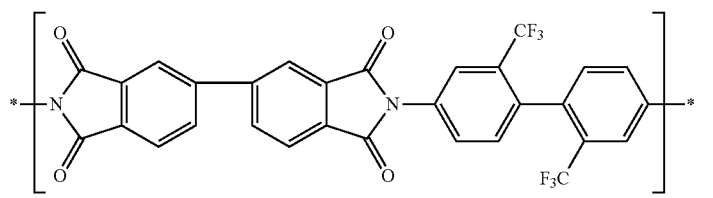

Chemical Formula 15

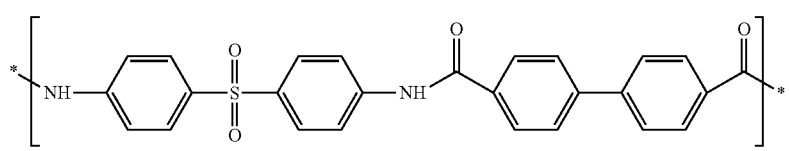

-continued

Chemical Formula 16

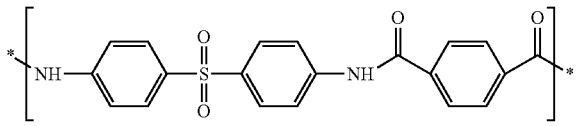

Chemical Formula 17

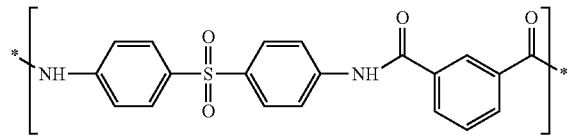

According to another embodiment, an article including the poly(amide-imide) block copolymer is provided.

Particularly, the article may be a film, a fiber, a coating material, or an adhesive.

The article may have total light transmittance of about 80% or higher in a wavelength range of about 380 nm to about 750 nm, and the article may have light transmittance of about 55% or higher for light of about a 400 nm wavelength.

The article may have a coefficient of thermal expansion of about 35 ppm/° C. or less.

The article may have haze of about 3% or less.

The article may have a yellowness index (YI) of about 3% or less.

According to yet another embodiment, a display device including the article is provided.

Also disclosed is a method for preparing a poly(amide-imide) block copolymer, the method including: providing a precursor of a first segment; providing a precursor of a second segment; copolymerizing the precursor of the first segment and the precursor of the second segment; and imidizing the precursor of the second segment to prepare the poly(amide-imide) block copolymer, wherein the poly(amide-imide) block copolymer comprises the poly(amide-imide) block copolymer disclosed above.

Also disclosed is a method for preparing an article, the method including disposing the poly(amide-imide) block copolymer disclosed above on a substrate to form a layer; drying the layer; delaminating the layer from the substrate; elongating the layer; and heat treating the layer.

Hereinafter, further embodiments will be described in further detail.

BRIEF DESCRIPTION OF THE DRAWINGS

The above and other aspects, advantages and features of this disclosure will become more apparent by describing in further detail embodiments thereof with reference to the accompanying drawings in which.

DETAILED DESCRIPTION

Figure 1:
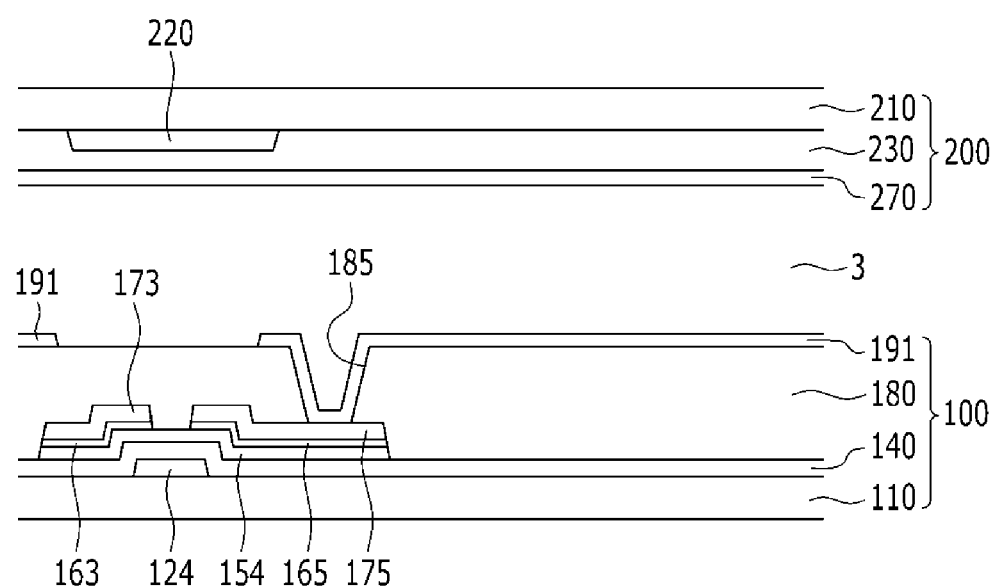
FIG. 1 is a cross-sectional view of an embodiment of a liquid crystal display ("LCD")

This disclosure will be described more fully hereinafter with reference to the accompanying drawings, in which various embodiments are shown. This disclosure may, however, be embodied in many different forms and should not be construed as limited to the exemplary embodiments set forth herein. Rather, these embodiments are provided so that this disclosure will be thorough and complete, and will fully convey the scope of the invention to those skilled in the art. Like reference numerals refer to like elements throughout.

The terminology used herein is for the purpose of describing particular embodiments only and is not intended to be limiting. As used here, the singular forms "a," "an," and "the" are intended to include the plural forms as well, unless the content clearly indicates otherwise. "Or" includes "and/or." It will be further understood that the terms "comprises" and/or "comprising," or "includes" and/or "including" when used in this specification specify the presence of stated features, regions, integers, steps, operations, elements, and/or components but do not preclude the presence or addition of one or more other features, regions, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning consistent with their meaning in the context of the relevant art and the present disclosure, and will not be interpreted in an idealized or overly formal sense unless expressly so defined herein.

Exemplary embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

As used herein, when a specific definition is not otherwise provided, the term "substituted" refers to a compound or group substituted with at least one (e.g. 1, 2, 3, 4, 5, 6 or more) substituent that does not significantly adversely affect the manufacture or use of the poly(amide-imide) copolymer, including a halogen (F, Br, Cl, or I), a hydroxyl group, a nitro group, a cyano group, an amino group $NH_2$, $NH(R^x)$, or $N(R^y)(R^z)$, wherein $R^x$, $R^y$, and $R^z$ are the same or different, and are each independently a C1 to C10 alkyl group, an azido group, an amidino group, a hydrazine group, a hydrazone group, a carboxyl group, a thiol group, a sulfonyl group, a thiocyano group, a C1 to C6 ester group, a ketone group, a substituted or unsubstituted C1 to C12 alkyl group, a substituted or unsubstituted C1 to C2 haloalkyl group, a substituted or unsubstituted C3 to C12 alicyclic organic group, a substituted or unsubstituted C6 to C12 aryl group, a substituted or unsubstituted C2 to C12 alkenyl group, a substituted or unsubstituted C2 to C12 alkynyl group, a substituted or unsubstituted C3 to C12 heteroaryl group, or a substituted or unsubstituted C4 to C12 heterocyclic group, in place of at least one hydrogen, provided that the substituted atom's normal valence is not exceeded, or the substituents may be linked to each other to provide a ring.

As used herein, when a specific definition is not otherwise provided, the term "alkyl group" refers to a straight or branched chain saturated aliphatic hydrocarbon having the specified number of carbon atoms, including a C1 to C30 alkyl group, and specifically a C1 to C15 alkyl group, having a valence of at least one, and optionally substituted with one or more substituents where indicated, provided that the valence of the alkyl group is not exceeded. Non-limiting examples include methyl, ethyl, n-propyl, isopropyl, n-butyl, 3-methylbutyl, t-butyl, n-pentyl, and sec-pentyl.

As used herein, the term "cycloalkyl group" refers to a group that comprises one or more rings in which all ring members are carbon, such that one ring is saturated, the group having the specified number of carbon atoms, having a valence of at least one, optionally bridged, and optionally substituted with one or more substituents where indicated, provided that the valence of the alkyl group is not exceeded. More than one ring may be present, and any additional rings may be independently aromatic, saturated or partially unsaturated, and may be fused, pendant (i.e. multiple rings linked via a single bond), spirocyclic, bridged, or a combination thereof. Non-limiting examples include cyclopropyl, cyclobutyl, cyclopentyl, cyclohexyl, cycloheptyl, cyclooctyl, and adamantyl. When the numbers of carbon atoms is specified, including a C3 to C30 cycloalkyl group, and specifically a C3 to C18 cycloalkyl group, the number means the number of ring members present in the one or more rings.

As used herein, the term "cycloalkenyl group" refers to a group that comprises one or more rings and one or more carbon-carbon double bonds in the ring such that one ring is partially saturated, wherein all ring members are carbon, the group having the specified number of carbon atoms, having a valence of at least one, optionally bridged, and optionally substituted with one or more substituents where indicated, provided that the valence of the alkyl group is not exceeded. More than one ring may be present, and any additional rings may be independently aromatic, saturated or partially unsaturated, and may be fused, pendant (i.e. multiple rings linked via a single bond), spirocyclic, bridged, or a combination thereof. Non-limiting examples include cyclopropenyl, cyclobutenyl, cyclopentenyl, cyclohexenyl, cycloheptenyl, and cyclooctenyl.

As used herein, the term "cycloalkynyl group" refers to a group that comprises one or more rings and one or more carbon-carbon triple bonds in the ring such that one ring is partially saturated, wherein all ring members are carbon, the group having the specified number of carbon atoms, having a valence of at least one, optionally bridged, and optionally substituted with one or more substituents where indicated, provided that the valence of the alkyl group is not exceeded. More than one ring may be present, and any additional rings may be independently aromatic, saturated or partially unsaturated, and may be fused, pendant (i.e. multiple rings linked via a single bond), spirocyclic, bridged, or a combination thereof. Non-limiting examples include cyclopropynyl, cyclobutynyl, cyclopentynyl, cyclohexynyl, cycloheptynyl, and cyclooctynyl.

As used herein, the term "cycloalkylene group" refers to a stable group that comprises one or more rings in which all ring members are carbon, such that one ring is saturated, the group having the specified number of carbon atoms, having a valence of at least two, formed by the removal of at least two hydrogen atoms from one or more rings of a cycloalkyl group, optionally bridged, and optionally substituted with one or more substituents where indicated, provided that the valence of the alkyl group is not exceeded. More than one ring may be present, and any additional rings may be independently aromatic, saturated or partially unsaturated, and may be fused, pendant (i.e. multiple rings linked via a single bond), spirocyclic, bridged, or a combination thereof. Non-limiting examples include cyclopropylene, cyclobutylene, cyclopentylene, cyclohexylene, cycloheptylene, cyclooctylene, and adamantylene.

As used herein, the term "cycloalkenylene group" refers to a stable aliphatic 5-15-membered monocyclic or polycyclic group, that comprises one or more rings and having at least one carbon-carbon double bond in the ring such that one ring is partially saturated, wherein all ring members are carbon, the group having the specified number of carbon atoms and having a valence of at least two, optionally bridged, and optionally substituted with one or more substituents where indicated, provided that the valence of the alkyl group is not exceeded. More than one ring may be present, and any additional rings may be independently aromatic, saturated or partially unsaturated, and may be fused, pendant (i.e. multiple rings linked via a single bond), spirocyclic, bridged, or a combination thereof. Unless mentioned otherwise, the cycloalkenylene group may be attached at any desired carbon atom provided that a stable structure is obtained. If the cycloalkenylene group is substituted, this may be so at any desired carbon atom, once again provided that a stable structure is obtained. Non-limiting examples include cyclopentenylene, cyclohexenylene, cycloheptenylene, cyclooctenylene, cyclononenylene, cyclodecenylene, norbornenylene, 2-methylcyclopentenylene, and 2-methylcyclooctenylene.

As used herein, the term "cycloalkynylene group" refers to a stable aliphatic 8- to 15-membered monocyclic or polycyclic group that comprises one or more rings and one or more carbon-carbon triple bonds in the ring such that one ring is partially saturated, wherein all ring members are carbon, the group having the specified number of carbon atoms and having a valence of at least two, optionally bridged, and optionally substituted with one or more substituents where indicated, provided that the valence of the alkyl group is not exceeded. More than one ring may be present, and any additional rings may be independently aromatic, saturated or partially unsaturated, and may be fused, pendant (i.e. multiple rings linked via a single bond), spirocyclic, bridged, or a combination thereof. Unless mentioned otherwise, the cycloalkynylene group may be attached at any desired carbon atom provided that a stable structure is obtained, and, if substituted, may be substituted at any suitable carbon atom which results in a stable structure. A cycloalkynylene group includes an 8- to 10-membered monocyclic or 12- to 15-membered bicyclic ring. Non-limiting examples include cyclooctynylene, cyclononynylene, cyclodecynylene, 2-methylcyclooctynylene, and the like.

As used herein, the term "alkoxy group" refers to an alkyl group as defined above that is linked via an oxygen (i.e., —O-alkyl). An alkoxy group includes a C1 to C30 alkoxy group, and specifically a C1 to C18 alkoxy group. Non-limiting examples include methoxy, ethoxy, propoxy, isobutyloxy, sec-butyloxy, pentyloxy, iso-amyloxy, and hexyloxy.

As used herein, the term "ester group" refers to a group of the formula —O(C=O)$R^x$ or a group of the formula —(C=O)O$R^x$ wherein $R^x$ is C1 to C28 aromatic organic group or aliphatic organic group. An ester group includes a C2 to C30 ester group, and specifically a C2 to C18 ester group.

As used herein, the term "ketone group" refers to a C2 to C30 ketone group, and specifically a C2 to C18 ketone group. Ketone groups have the indicated number of carbon atoms, with the carbon of the keto group being included in the numbered carbon atoms. For example a C2 ketone group is an acetyl group having the formula $CH_3(C=O)$—.

As used herein, the term "aryl group" refers to a cyclic group that comprises one or more rings in which all ring members are carbon and at least one ring is aromatic, the group having the specified number of carbon atoms, including a C6 to C30 aryl group, and specifically a C6 to C18 aryl group, having a valence of at least one, optionally substituted with one or more substituents where indicated, provided that the valence of the aryl group is not exceeded. More than one ring may be present, and any additional rings may be independently aromatic, saturated or partially unsaturated, and may be fused, pendant (i.e. multiple rings linked via a single bond), spirocyclic, bridged, or a combination thereof. Non-limiting examples include phenyl, naphthyl, including 1-naphthyl and 2-naphthyl, tetrahydronaphthyl, and bi-phenyl.

As used herein, the term "aryloxy group" refers to an aryl group as defined above that is linked via an oxygen (i.e., —O-arylene). An aryloxy group includes a C6 to C30 aryloxy group, and specifically a C6 to C18 aryloxy group. Non-limiting examples include phenoxy, naphthyloxy, and tetrahydronaphthyloxy.

As used herein, the term "alkenyl group" refers to a straight or branched chain hydrocarbon having at least one carbon-carbon double bond, having the specified number of carbon atoms, having a valence of at least one, and optionally substituted with one or more substituents where indicated, provided that the valence of the alkenyl group is not exceeded. An alkenyl group includes a C2 to C30 alkenyl group, and specifically a C2 to C18 alkenyl group. Non-limiting examples include ethenyl, n-propenyl, isopropenyl, n-butenyl, 3-methylbutenyl, t-butenyl, n-pentenyl, and sec-pentenyl.

As used herein, the term "alkynyl group" refers to a straight or branched chain hydrocarbon having at least one carbon-carbon triple bond and the specified number of carbon atoms, having a valence of at least one, and optionally substituted with one or more substituents where indicated, provided that the valence of the alkynyl group is not exceeded. An alkynyl group includes a C2 to C30 alkynyl group, and specifically a C2 to C18 alkynyl group. Non-limiting examples include ethynyl, n-propynyl, isopropynyl, n-butynyl, 3-methylbutynyl, t-butynyl, n-pentynyl, and sec-pentynyl.

As used herein, the term "alkylene group" refers to a straight or branched chain, saturated hydrocarbon group having a valence of at least two, optionally substituted with one or more substituents where indicated, provided that the valence of the alkyl group is not exceeded, and having the specified number of carbon atoms. An alkylene group includes a C1 to C30 alkylene group, and specifically a C1 to C18 alkylene group. Non-limiting examples include methylene (—$CH_2$—), ethylene (—$CH_2CH_2$—), and propylene (—$(CH_2)_3$—).

As used herein, the term "alkenylene group" refers to a straight or branched chain hydrocarbon group having at least one carbon-carbon double bond and having a valence of at least two, optionally substituted with one or more substituents where indicated, provided that the valence of the alkenyl group is not exceeded, and having the specified number of carbon atoms. An alkenylene group includes a C2 to C30 alkenylene group, and specifically a C2 to C18 alkenylene group. Non-limiting examples include ethenylene, n-propenylene, isopropenylene, n-butenylene, 3-methylbutenylene, t-butenylene, n-pentenylene, and sec-pentenylene.

As used herein, the term "alkynylene group" refers to a straight or branched chain hydrocarbon having one or more unsaturated carbon-carbon bonds, at least one of which is a triple bond, having a valence of at least two, optionally substituted with one or more substituents where indicated, provided that the valence of the alkynyl group is not exceeded, and having the specified number of carbon atoms. An alkynylene group includes a C2 to C30 alkynylene group, and specifically a C2 to C18 alkynylene group. Non-limiting examples include ethynylene, n-propynylene, isopropynylene, n-butynylene, 3-methylbutynylene, t-butynylene, n-pentynylene, and sec-pentynylene.

As used herein, the term "arylene group" refers to a cyclic group that comprises one or more rings in which all ring members are carbon and at least one ring is aromatic, the group having the specified number of carbon atoms, having a valence of at least two, formed by the removal of two hydrogen atoms from one or more rings of an aromatic hydrocarbon, wherein the hydrogen atoms may be removed from the same or different rings (preferably different rings), optionally substituted with one or more substituents where indicated, provided that the valence of the aryl group is not exceeded. More than one ring may be present, and any additional rings may be independently aromatic, saturated or partially unsaturated, and may be fused, pendant (i.e. multiple rings linked via a single bond), spirocyclic, bridged, or a combination thereof. An arylene group includes a C6 to C30 arylene group, and specifically a C6 to C18 arylene group. Non-limiting examples include phenylene, naphthylene, including 1-naphthylene and 2-naphthylene, tetrahydronaphthylene, and bi-phenylene.

As used herein, the term "aryleneoxy group" refers to an arylene group as defined above that is linked via an oxygen (i.e., —O-arylene). An aryleneoxy group includes a C6 to C30 aryleneoxy group, and specifically a C6 to C18 aryleneoxy group. Non-limiting examples include phenyleneoxy, naphthyleneoxy, and tetrahydronaphthyleneoxy.

As used herein, the prefix "hetero" refers to a compound or group that comprises at least one heteroatom covalently bonded to one or more carbon atoms of the group. Each heteroatom is independently chosen from nitrogen (N), oxygen (O), sulfur (S), phosphorus (P), and silicon (Si).

As used herein, the term "heteroaryl group" refers to an aryl group comprising a hetero atom as defined above. Heteroaryl group includes C3 to C12 carbon atoms. Non-limiting examples include furyl, thienyl, pyrolyl, oxazolyl, pyridyl, quinolynyl, and carbazolyl.

As used herein, the term "electron withdrawing group" refers to a halogen atom, nitro group, cyano group, C1 to C2 haloalkyl group, C1 to C6 alkanoyl group, C1 to C6 ester group, etc.

As used herein, the term "haloalkyl group" refers to an alkyl group as defined above, having one or more hydrogen atoms replaced by one or more halogen atoms, generally up to the maximum allowable number of halogen atoms. Non-limiting examples include trifluoromethyl, difluoromethyl, 2-fluoroethyl, and penta-fluoroethyl.

As used herein, the term "alkanoyl group" refers to an alkyl group as defined above, attached through a keto (—(C=O)—) bridge. Alkanoyl groups have the indicated number of carbon atoms, with the carbon of the keto group being included in the numbered carbon atoms. For example a C2 alkanoyl group is an acetyl group having the formula $CH_3(C=O)$—.

As used herein, the term "aliphatic organic group" refers to a C1 to C30 alkyl group, a C2 to C30 alkenyl group, a C2 to C30 alkynyl group, a C1 to C30 alkylene group, a C2 to C30 alkenylene group, or a C2 to C30 alkynylene group, specifically a C1 to C15 alkyl group, a C2 to C15 alkenyl group, a C2 to C15 alkynyl group, a C1 to C15 alkylene group, a C2 to C15 alkenylene group, or a C2 to C15 alkynylene group, each as defined above.

As used herein, the term "alicyclic organic group" refers to a C3 to C30 cycloalkyl group, a C3 to C30 cycloalkenyl group, a C3 to C30 cycloalkynyl group, a C3 to C30 cycloalkylene group, a C3 to C30 cycloalkenylene group, or a C3 to C30 cycloalkynylene group, specifically a C3 to C15 cycloalkyl group, a C3 to C15 cycloalkenyl group, a C3 to C15 cycloalkynyl group, a C3 to C15 cycloalkylene group, a C3 to C15 cycloalkenylene group, or a C3 to C15 cycloalkynylene group, each as defined above.

As used herein, the term "aromatic organic group" refers to a C6 to C30 aryl group or a C6 to C30 arylene group, each as defined above, specifically a C6 to C16 aryl group or a C6 to C16 arylene group.

As used herein, the term "heterocyclic group" refers to a C2 to C30 heterocycloalkyl group, a C2 to C30 heterocycloalkylene group, a C2 to C30 heterocycloalkenyl group, a C2 to C30 heterocycloalkenylene group, a C2 to C30 heterocycloalkynyl group, a C2 to C30 heterocycloalkynylene group, a C2 to C30 heteroaryl group, or a C2 to C30 heteroarylene group wherein 1 to 3 heteroatoms independently selected from O, S, N, P, Si, and a combination thereof, may be present as a ring member in one ring or in multiple rings, specifically a C2 to C15 heterocycloalkyl group, a C2 to C15 heterocycloalkylene group, a C2 to C15 heterocycloalkenyl group, a C2 to C15 heterocycloalkenylene group, a C2 to C15 heterocycloalkynyl group, a C2 to C15 heterocycloalkynylene group, a C2 to C15 heteroaryl group, or a C2 to C15 heteroarylene group, each as defined above, i.e., including 1 to 3 heteroatoms selected from O, S, N, P, Si, and a combination thereof, in at least one ring. If multiple rings are present, each ring is independently aromatic, saturated or partially unsaturated and multiple rings, if present, may be fused, pendant (i.e. multiple rings linked via a single bond), spirocyclic or a combination thereof. Heterocycloalkyl groups comprise at least one non-aromatic ring that contains a heteroatom ring member. Aromatic and/or carbocyclic rings may also be present in a heterocycloalkyl group, provided that at least one ring is saturated or partially unsaturated and contains a ring member that is a heteroatom. Non-limiting examples of heterocycloalkyl groups include morpholinyl, piperazinyl, piperidinyl, and pyrrolidinyl groups. Heteroaryl groups comprise at least one aromatic ring that contains a heteroatom ring member. Non-aromatic and/or carbocyclic rings may also be present in a heteroaryl group, provided that at least one ring is both aromatic and contains a ring member that is a heteroatom. Non-limiting examples of heteroaryl groups include pyridyl, indolyl, pyrimidinyl, pyridizinyl, pyrazinyl, imidazolyl, oxazolyl, furanyl, thiophenyl, thiazolyl, triazolyl, and tetrazolyl.

As used herein, when a definition is not otherwise provided, "contacting" includes mixing to permit, for example, reaction or copolymerization of contacted compounds.

In addition, in a chemical formula the mark "*" refers to a point of attachment with the same or different atom or chemical formula.

According to an embodiment, a poly(amide-imide) block copolymer is provided that includes a first segment including a repeating unit represented by the following Chemical Formula 1A, a repeating unit represented by the following Chemical Formula 1B, a repeating unit represented by the following Chemical Formula 1C, or a combination thereof, and a second segment including a repeating unit represented by the following Chemical Formula 2.

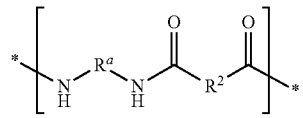

Chemical Formula 1A

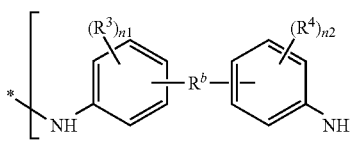

Chemical Formula 1B

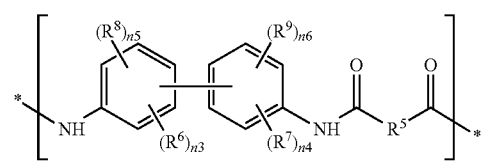

Chemical Formula 1C

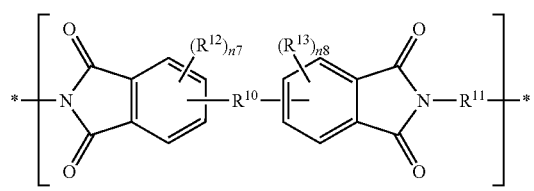

Chemical Formula 2

In Chemical Formula 1A, each $R^a$ may be the same or different in each repeating unit and each may independently be a substituted or unsubstituted C3 to C30 aliphatic group or a substituted or unsubstituted C13 to C20 fluorenylene group.

In an embodiment, $R^a$ is represented by Chemical Formula 3:

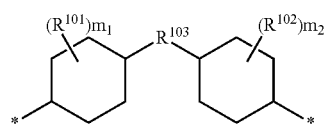

Chemical Formula 3

In Chemical Formula 3, $R^{101}$ and $R^{102}$ may be the same or different and may each be independently hydrogen, a halogen, a hydroxyl group, an ether group of the formula —$OR^{208}$ wherein $R^{208}$ is a C1 to C10 aliphatic organic group, a silyl group of the formula —$SiR^{209}R^{210}R^{211}$ wherein $R^{209}$, $R^{210}$, and $R^{211}$ are the same or different and are each independently hydrogen or a C1 to C10 aliphatic organic group, a substituted or unsubstituted C1 to C10 aliphatic organic group, or a C6 to C20 aromatic organic group. In an embodiment, $R^{101}$ and $R^{102}$ are the same or different and are each independently hydrogen, a halogen, a hydroxyl group, a C1 to C10 alkyl group, or a C6 to C20 aryl group.

Each $R^{103}$ may be the same or different in each repeating unit and each may independently be a bond, a substituted or unsubstituted C1 to C20 aliphatic group, or a substituted or unsubstituted C6 to C30 aromatic group. In an embodiment, $R^{103}$ is the same or different in each repeating unit and each is independently a bond, a C1 to C20 alkylene group, or a C6 to C30 arylene group.

Each $m_1$ and $m_2$ may independently be an integer in the range of 0 to 4.

In an embodiment, $R^a$ is:

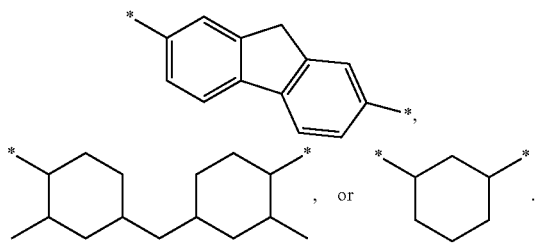, or .

Each $R^2$ may be the same or different in each repeating unit and each may independently be a substituted or unsubstituted C6 to C30 aromatic group. More particularly $R^2$ may be a phenylene group, a naphthylene group, a biphenylene group, a triphenylene group, or a multi-ring system comprising two C6 to C20 arylene groups attached via a C1 to C2 haloalkyl substituted C1 to C10 alkylene group, each optionally substituted with 0, 1, or more substituents independently chosen from hydrogen, deuterium, a halogen, a C1 to C6 alkanoyl group, a C1 to C10 alkyl group, a C6 to C20 aryl group, and C1 to C2 haloalkyl group. Still more particularly, $R^2$ may be phenylene optionally substituted with a napthyl, biphenyl, or triphenyl group.

In an embodiment, each $R^2$ may be the same or different in each repeating unit and each may independently be according to the following chemical formulas, but is not limited thereto.

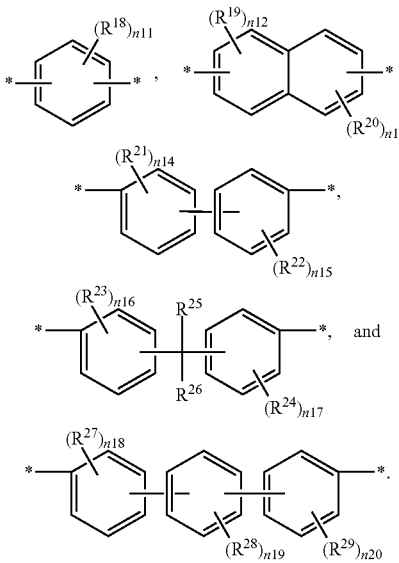

In the above chemical formulas, $R^{18}$ to $R^{29}$ are the same or different and are each independently hydrogen, deuterium, a halogen, a substituted or unsubstituted C1 to C10 aliphatic group, or a substituted or unsubstituted C6 to C20 aromatic group, or a C1 to C2 haloalkyl group, n11 and n14 to n20 are each independently integers ranging from 0 to 4, and n12 and n13 are each independently integers ranging from 0 to 3.

In an embodiment, $R^{18}$ to $R^{29}$ are the same or different and are each independently hydrogen, a halogen, a substituted or unsubstituted C1 to C10 alkyl group, or a substituted or unsubstituted C6 to C20 aryl group.

More particularly, $R^2$ may be the same or different and each may independently be according to the following chemical formulas, but is not limited thereto.

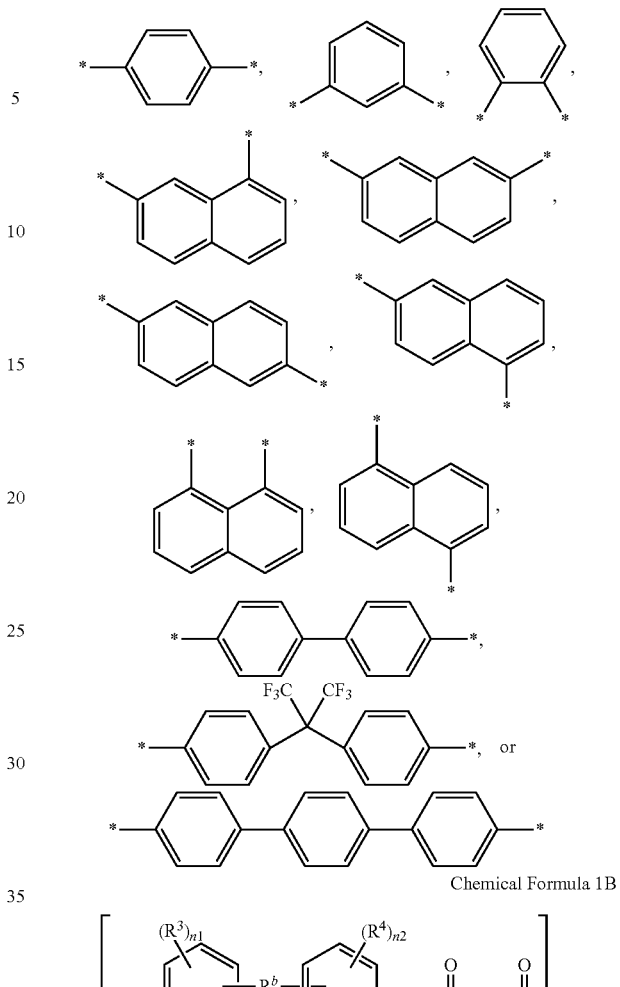

Chemical Formula 1B

In Chemical Formula 1B, each $R^b$ may be the same or different in each repeating unit and each may independently be a single bond, a substituted or unsubstituted C3 to C30 aliphatic organic group, a substituted or unsubstituted C3 to C30 alicyclic organic group, a substituted or unsubstituted C6 to C30 aromatic organic group, a substituted or unsubstituted C2 to C30 heterocyclic group, a substituted or unsubstituted C13 to C20 fluorenylene group, —O—, —S—, —S(=O)$_2$—, or —C(=O)—. More specifically, $R^b$ may be a substituted or unsubstituted C3 to C20 alicyclic group, a substituted or unsubstituted C2 to C15 heterocyclic group, or a substituted or unsubstituted C13 to C20 fluorenylene group. Still more specifically, $R^b$ may be a substituted or unsubstituted C3 to C18 cycloalkylene group, a C3 to C18 cycloalkenylene group optionally bridged and/or optionally substituted with an oxo group, a substituted or unsubstituted C2 to C15 heterocycloalkenylene group, or a substituted or unsubstituted C13 to C20 fluorenylene group.

In an embodiment, $R^b$ is the same or different in each repeating unit and each is independently a single bond, a substituted or unsubstituted C3 to C30 alkylene group, a substituted or unsubstituted C3 to C30 cycloalkylene group, a substituted or unsubstituted C6 to C30 arylene group, a substituted or unsubstituted C13 to C20 fluorenylene group, —O—, —S—, —S(=O)$_2$—, or —C(=O)—. Even more specifically, $R^b$ may be a cyclohexylene or fluorenylene.

In an embodiment, $R^b$ is the same or different in each repeating unit and each is independently according to the following chemical formulas, but is not limited thereto.

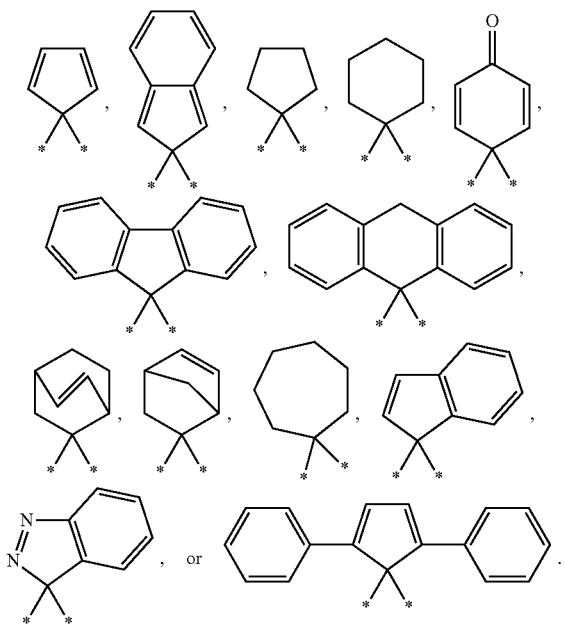

In Chemical Formula 1B, $R^2$ is as provided above.

Each $R^3$ and $R^4$ may be the same or different and may each independently be hydrogen, a halogen, a hydroxyl group, an ether group of the formula —$OR^{200}$ wherein $R^{200}$ is a C1 to C10 aliphatic organic group, a silyl group of the formula —$SiR^{201}R^{202}R^{203}$ wherein $R^{201}$, $R^{202}$, and $R^{203}$ are the same or different and are each independently hydrogen or a C1 to C10 aliphatic organic group, a substituted or unsubstituted C1 to C10 aliphatic organic group, or a C6 to C20 aromatic organic group. An embodiment wherein $R^3$ and $R^4$ are each hydrogen or —$CF_3$ is specifically mentioned.

In an embodiment, $R^3$ and $R^4$ may be the same or different and may each independently be hydrogen, a halogen, a hydroxyl group, a substituted or unsubstituted C1 to C10 alkyl group, or a substituted or unsubstituted C1 to C10 aryl group.

Each of n1 and n2 may independently be an integer ranging from 0 to 4, specifically 1 to 3, more specifically 2.

Chemical Formula 1C

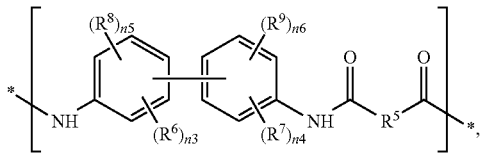

In Chemical Formula 1C, $R^5$ may be the same or different in each repeating unit and each may independently be a substituted or unsubstituted C6 to C30 aromatic organic group. In an embodiment, $R^5$ is a phenylene group, a naphthylene group, a biphenylene group, a triphenylene group, or a multi-ring system comprising two C6 to C20 arylene groups attached via a C1 to C2 haloalkyl substituted C1 to C10 alkylene group, each optionally substituted with 0, 1, or more substituents independently chosen from hydrogen, deuterium, a halogen, a C1 to C6 alkanoyl group, a C1 to C10 alkyl group, and a C6 to C20 aryl group. Still more particularly, $R^5$ is phenylene optionally substituted with a fluorine, naphthylene, biphenylene, or triphenylene.

In an embodiment, $R^5$ is the same or different in each repeating unit and each is independently according to the following chemical formulas, but is not limited thereto.

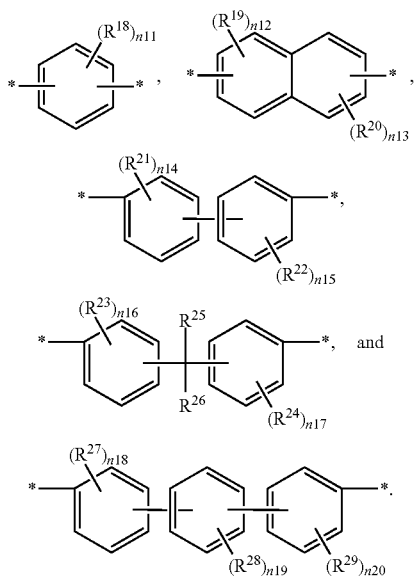

In the above chemical formulas, $R^{18}$ to $R^{29}$ and n11 to n20 are the same as described in Chemical Formula 1A for $R^2$.

Also, each $R^5$ may independently be according to the following chemical formulas, but is not limited thereto.

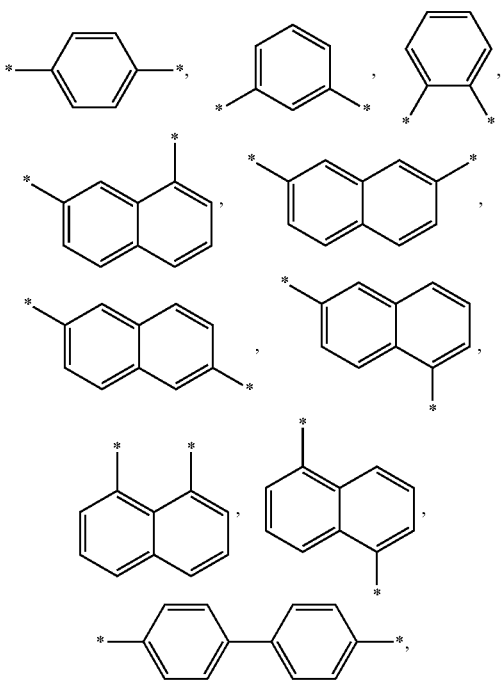

-continued

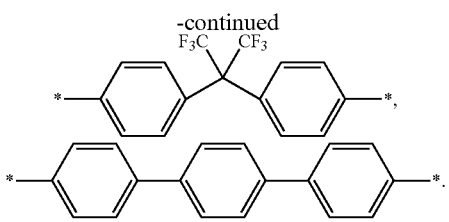

$R^6$ and $R^7$ may be the same or different and are each independently an electron withdrawing group. Particularly, $R^6$ and $R^7$ may be the same or different and may each independently be a halogen, a nitro group, a cyano group, a C1 to C2 haloalkyl group, a C1 to C6 alkanoyl group, or a C1 to C6 ester group. In an embodiment, $R^6$ and $R^7$ may be the same or different and are each independently be —$CF_3$, —$CCl_3$, —$CBr_3$, —$Cl_3$, —F, —Cl, —Br, —I, —$NO_2$, —CN, —$COCH_3$, or —$CO_2C_2H_5$, but are not limited thereto.

$R^8$ and $R^9$ may be the same or different and may each independently be hydrogen, a halogen, a hydroxyl group, an ether group of the formula —$OR^{204}$ wherein $R^{204}$ is a C1 to C10 aliphatic organic group, a silyl group of the formula —$SiR^{205}R^{206}R^{207}$ wherein $R^{205}$, $R^{206}$, and $R^{207}$ are the same or different and are each independently hydrogen or a C1 to C10 aliphatic organic group, a substituted or unsubstituted C1 to C10 aliphatic organic group, or a C6 to C20 aromatic organic group. An embodiment wherein $R^8$ and $R^9$ are each hydrogen or —$CF_3$ is specifically mentioned.

Further, n3 may be an integer ranging from 1 to 4, n5 may an integer ranging from 0 to 4, and the sum of n3 and n5 may an integer ranging from 1 to 4, and n4 may an integer ranging from 1 to 4, n6 may be an integer ranging from 0 to 4, and the sum of n4 and n6 may an integer ranging from 1 to 4.

The first segment including the repeating unit represented by Chemical Formula 1A, the repeating unit represented by Chemical Formula 1B, and the repeating unit represented by Chemical Formula 1C, or a combination thereof, is an amide block, and it has excellent or improved solubility in a solvent, as well as suitable workability, flexibility, and optical properties, and may decrease a coefficient of thermal expansion. Therefore, the poly(amide-imide) block copolymer including the first segment may have excellent optical properties, for example transparency, and excellent workability and flexibility, as well as a low coefficient of thermal expansion.

The poly(amide-imide) block copolymer includes about 1 to about 1000 repeating units of the repeating unit represented by Chemical Formula 1A, the repeating unit represented by Chemical Formula 1C, the repeating unit represented by Chemical Formula 1C, or a combination thereof. When the first segment is included as a block of this size, the optical properties, workability, and flexibility of the poly(amide-imide) block copolymer including the first segment may be effectively improved. Particularly, the first segments are the same or different and each may independently include about 1 to about 100 repeating units of the repeating unit represented by Chemical Formula 1A, the repeating unit represented by Chemical Formula 1B, the repeating unit represented by Chemical Formula 1C, or a combination thereof. More particularly, the first segments may be the same or different and each of them may independently include about 1 to about 20 repeating units of the repeating unit represented by Chemical Formula 1A, the repeating unit represented by Chemical Formula 1B, the repeating unit represented by Chemical Formula 1C, or a combination thereof.

The first segment may have a weight average molecular weight of about 500 grams per mole (g/mol) to about 50,000 g/mol. When the weight average molecular weight of the first segment is within this range, the optical properties, workability, and flexibility of the poly(amide-imide) block copolymer including the first segment, may be effectively improved. Particularly, the first segment may have a weight average molecular weight of about 5000 g/mol to about 30,000 g/mol, and more particularly the first segment may have a weight average molecular weight of about 7500 g/mol to about 25,000 g/mol.

Chemical Formula 2

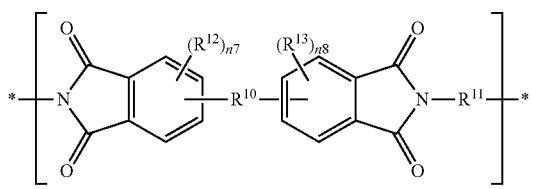

In Chemical Formula 2, each $R^{10}$ is the same or different in each repeating unit and each may independently be a single bond, a substituted or unsubstituted C1 to C30 aliphatic organic group, a substituted or unsubstituted C3 to C30 alicyclic organic group, a substituted or unsubstituted C6 to C30 aromatic organic group, or a substituted or unsubstituted C2 to C30 heterocyclic group. Particularly $R^{10}$ may be a single bond, —S($=$O$)_2$—, —C($=$O)—, or a substituted or unsubstituted C1 to C10 aliphatic organic group. An embodiment wherein $R^{10}$ is a single bond or —C($CF_3)_2$— is specifically mentioned.

Each $R^{11}$ may be the same or different in each repeating unit and each may independently be a substituted or unsubstituted C3 to C30 aliphatic organic group, a substituted or unsubstituted C3 to C30 alicyclic organic group, a substituted or unsubstituted C6 to C30 aromatic organic group, wherein the aromatic organic group is present singularly or at least two are linked to provide a condensed cycle or at least two are linked by a single bond, a substituted or unsubstituted C13 to C20 fluorenylene group, —O—, —S—, —C($=$O)—, —CH (OH)—, —S($=$O$)_2$—, —Si($CH_3)_2$—, —$(CH_2)_p$— wherein $1 \leq p \leq 10$, —$(CF_2)_q$— wherein $1 \leq q \leq 10$, —C($CH_3)_2$—, —C($CF_3)_2$—, or —C($=$O)NH—. In an embodiment at least one hydrogen of the aromatic organic group of $R^{11}$ may be may be substituted with an electron withdrawing group. Herein, the electron withdrawing group is the same as described above.

In an embodiment, $R^{11}$ is the same or different in each repeating unit and each independently comprises a substituted or unsubstituted C3 to C30 alkylene group, a substituted or unsubstituted C3 to C30 cycloalkylene group, a substituted or unsubstituted C6 to C30 arylene group, a substituted or unsubstituted C13 to C20 fluorenylene group, —O—, —S—, —C($=$O)—, —CH(OH)—, —S($=$O$)_2$—, —Si($CH_3)_2$—, —$(CH_2)_p$— wherein $1 \leq p \leq 10$, —$(CF_2)_q$— wherein $1 \leq q \leq 10$, —C($CH_3)_2$—, —C($CF_3)_2$—, or —C($=$O)NH—.

Each $R^{12}$ and $R^{13}$ may be the same or different and each may independently be hydrogen, a halogen, a hydroxyl group, an ether group of the formula —$OR^{208}$ wherein $R^{208}$ is a C1 to C10 aliphatic organic group, a silyl group of the formula —$SiR^{209}R^{210}R^{211}$ wherein $R^{209}$, $R^{210}$, and $R^{211}$ are the same or different and are each independently hydrogen or a C1 to C10 aliphatic organic group, a substituted or unsubstituted C1 to C10 aliphatic organic group, a substituted or unsubstituted C3 to C30 alicyclic organic group, or a C6 to C20 aromatic organic group.

In an embodiment, $R^{12}$ and $R^{13}$ are the same or different and are each independently hydrogen, a halogen, a hydroxyl group, a substituted or unsubstituted C1 to C10 alkyl group a substituted or unsubstituted C3 to C15 cycloalkyl group, or a C6 to C20 aryl group.

n7 and n8 may be each independently be an integer ranging from 0 to 3.

The second segment including the repeating unit represented by Chemical Formula 2 is an imide block. The second segment has excellent heat resistance and mechanical strength, and when an article is manufactured including the poly(amide-imide) block copolymer, the article has excellent solvent resistance, and when it is elongated, the generation of crystals may be suppressed. Accordingly, the poly(amide-imide) block copolymer including the second segment may have excellent or improved thermal characteristics and mechanical strength.

The poly(amide-imide) block copolymer may include about 1 to about 1000 repeating units of the repeating unit represented by Chemical Formula 2. When the second segment is included as a block of the above size, the thermal characteristics and mechanical strength of the poly(amide-imide) block copolymer including the second segment may be effectively improved, and the optical properties may be improved as well. Particularly, the second segments may be the same or different and each may independently include about 1 to about 100 repeating units of the repeating unit represented by Chemical Formula 2. According to an embodiment, the second segment may include about 1 to about 20 of the repeating units of the repeating unit represented by Chemical Formula 2.

The second segment may have a weight average molecular weight of about 500 grams per mole (g/mol) to about 50,000 g/mol. When the weight average molecular weight of the second segment falls within this range, the thermal characteristics and mechanical strength of the poly(amide-imide) block copolymer including the second segment, may be effectively improved, and the optical properties may be improved as well. Particularly, the second segment may have a weight average molecular weight of about 5000 g/mol to about 30,000 g/mol, and more particularly the precursor of the second segment may have a weight average molecular weight of about 12,500 g/mol to about 30,000 g/mol.

The first segment may further include a repeating unit represented by the following Chemical Formula 4.

Chemical Formula 4

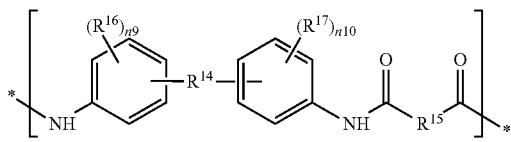

In Chemical Formula 4, $R^{14}$ may the same or different in each repeating unit and each may independently be —O—, —S—, —C(=O)—, —CH(OH)—, —S(=O)$_2$—, —Si(CH$_3$)$_2$—, —(CH$_2$)$_p$— wherein 1≤p≤10, —(CF$_2$)$_q$— wherein 1≤q≤10, —C(CH$_3$)$_2$—, —C(CF$_3$)$_2$—, —C(=O)NH—, or a substituted or unsubstituted C6 to C30 aromatic organic group, wherein the aromatic organic group is present singularly or at least two are linked to provide a condensed cycle or at least two are linked by a single bond, a fluorenylene group, —O—, —S—, —C(=O)—, —CH(OH)—, —S(=O)$_2$—, —Si(CH$_3$)$_2$—, —(CH$_2$)$_p$— wherein 1≤p≤10, —(CF$_2$)$_q$— wherein 1≤q≤10, —C(CH$_3$)$_2$—, —C(CF$_3$)$_2$—, or —C(=O)NH—. An embodiment wherein $R^{14}$ is S(=O)$_2$ is specifically mentioned.

In an embodiment, $R^{14}$ is a single bond, a substituted or unsubstituted C3 to C30 cycloalkylene group, a substituted or unsubstituted C6 to C30 arylene group, a substituted or unsubstituted C13 to C20 fluorenylene group, —O—, —S—, —S(=O)$_2$—, or —C(=O)—.

Each $R^{15}$ may be the same or different in each repeating unit and each may independently be a substituted or unsubstituted C6 to C30 aromatic organic group. An embodiment wherein $R^{15}$ is a phenylene group or a biphenylene group is specifically mentioned. Also, $R^{15}$ may be a naphthylene group, a triphenylene group, or a multi-ring system comprising two C6 to C20 arylene groups attached via a C1 to C2 haloalkyl substituted C1 to C10 alkylene group, each optionally substituted with 0, 1, or more substituents independently chosen from hydrogen, deuterium, a halogen, a C1 to C6 alkanoyl group, a C1 to C10 alkyl group, and a C6 to C20 aryl group. Still more particularly $R^{15}$ is phenylene optionally substituted with a fluorine, naphthylene, biphenylene, or triphenylene.

In an embodiment, $R^{15}$ is

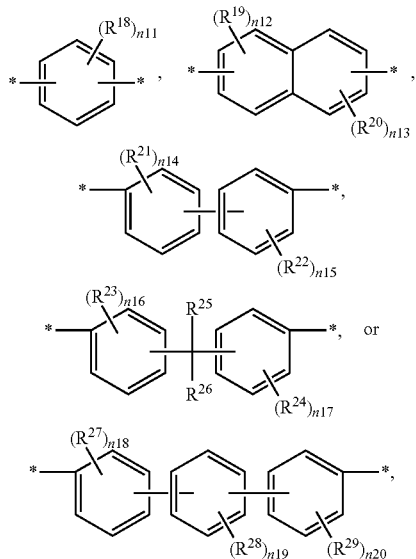

wherein, in the above chemical formulas, $R^{18}$ to $R^{29}$ are the same or different and are each independently hydrogen, deuterium, a halogen, a substituted or unsubstituted C1 to C10 aliphatic organic group, or a substituted or unsubstituted C6 to C20 aromatic organic group, n11 and n14 to n20 are each independently an integer ranging from 0 to 4, and n12 and n13 are each independently an integer ranging from 0 to 3.

$R^{16}$ and $R^{17}$ may be the same or different and are each independently hydrogen, a halogen, a hydroxyl group, an ether group of the formula —OR$^{212}$ wherein R$^{212}$ is a C1 to C10 aliphatic organic group, a silyl group —SiR$^{213}$R$^{214}$R$^{215}$ wherein R$^{213}$, R$^{214}$, and R$^{215}$ are the same or different and are each independently hydrogen or a C1 to C10 aliphatic organic group, a substituted or unsubstituted C1 to C10 aliphatic organic group, or a C6 to C20 aromatic organic group.

In an embodiment, $R^{16}$ and $R^{17}$ are each independently hydrogen, a halogen, a hydroxyl group, a substituted or unsubstituted C1 to C10 alkyl group, or a substituted or unsubstituted C6 to C20 aryl group.

n9 and n10 may each independently be an integer ranging from 0 to 4.

In the poly(amide-imide) block copolymer, when the first segment further includes a repeating unit represented by the above Chemical Formula 4, light transmission may be improved.

In the poly(amide-imide) block copolymer, the total moles of a repeating unit of the first segment and the total moles of a repeating unit of the second segment may be present at a mole ratio of about 95:5 to about 5:95. When the mole ratio of the total moles of the repeating units in the first segment to the total moles of the repeating unit in the second segment is within this range, the poly(amide-imide) block copolymer may have excellent or improved optical properties, heat resistance, mechanical strength, and flexibility. Particularly, in the poly(amide-imide) block copolymer, the total moles of the first segment and the total moles of a repeating unit in the second segment may be present at a mole ratio of about 90:10 to about 10:90.

The repeating unit represented by Chemical Formula 2 may include a repeating unit represented by the following Chemical Formula 5.

Chemical Formula 5

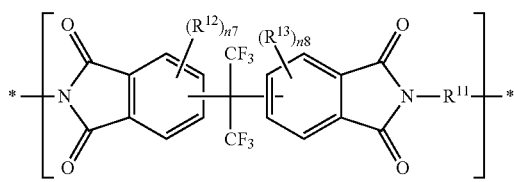

In Chemical Formula 5, $R^{11}, R^{12}, R^{13}$, n7, and n8 are the same as defined in Chemical Formula 2.

When the second segment includes a repeating unit represented by the above Chemical Formula 5, in the poly(amide-imide) block copolymer, the total moles of the repeating unit of the first segment and the total moles of the repeating unit of the second segment may be present at a mole ratio of about 95:5 to about 5:95. When the mole ratio of the total moles of the repeating unit of the first segment to the total mole of the repeating unit of the second segment is within this range, the poly(amide-imide) block copolymer may have excellent or improved heat resistance, mechanical strength, and flexibility, and it may also have excellent or improved optical properties, and particularly, excellent or improved light transmission. Particularly, the total moles of the repeating unit of the first segment to the total moles of the repeating unit in the second segment may be present at a mole ratio of about 90:10 to about 10:90.

The repeating unit represented by Chemical Formula 2 may include a repeating unit represented by the following Chemical Formula 6.

Chemical Formula 6

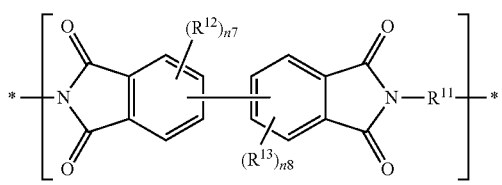

In Chemical Formula 6, $R^{11}, R^{12}, R^{13}$, n7, and n8 are the same as defined in Chemical Formula 2.

When the second segment includes a repeating unit represented by the above Chemical Formula 6, in the poly(amide-imide) block copolymer, the total moles of the repeating unit of the first segment to the total moles of the repeating unit of the second segment may be present at a mole ratio of about 95:5 to about 5:95. When the mole ratio of the total moles of the repeating unit of the first segment to the total moles of the repeating unit of the second segment is within this range, the poly(amide-imide) block copolymer may have excellent or improved optical properties, heat resistance, mechanical strength, and flexibility, and may improve processability due to its excellent or improved solvent resistance. Particularly, the total moles of the repeating unit of the first segment to the total moles of the repeating unit of the second segment may be present at a mole ratio of about 95:5 to about 20:80.

In an embodiment, in the poly(amide-imide) block copolymer, the repeating unit represented by Chemical Formula 2 may include repeating units represented by the above Chemical Formulas 5 and 6.

When the second segment includes repeating units represented by the above Chemical Formulas 5 and 6, the repeating units represented by the above Chemical Formula 5 and the repeating units represented by the above Chemical Formula 6 may be present at a mole ratio of about 99:1 to about 1:99. When the mole ratio of the repeating units represented by the above Chemical Formula 5 to the repeating unit represented by the above Chemical Formula 6 are within this range, the solvent resistance of the poly(amide-imide) block copolymer may be effectively improved. Particularly, the repeating units represented by the above Chemical Formula 5 and the repeating units represented by the above Chemical Formula 6 may be present at a mole ratio of about 99:1 to about 10:90.

When the second segment includes the repeating units represented by the above Chemical Formulas 5 and 6, in the poly(amide-imide) block copolymer the total moles of the repeating units of the first segment and the total moles of the repeating units in the second segment may be present at a mole ratio of about 95:5 to about 5:95. When the mole ratio of the total moles of the repeating units of the first segment to the total moles of the repeating units of the second segment are within this range, the poly(amide-imide) block copolymer may have excellent or improved heat resistance, mechanical strength, and flexibility, and it may also have excellent or improved optical properties, and particularly, light transmission, and it may improve the processability due to its excellent or improved solvent resistance. Particularly, the total moles of the repeating units of the first segment and the total moles of the repeating unit of the second segment may be present at a mole ratio of about 90:10 to about 10:90.

In an embodiment, in the poly(amide-imide) block copolymer, the repeating unit represented by Chemical Formula 1B may include repeating units represented by the following Chemical Formulas 7 to 9, the repeating unit represented by Chemical Formula 1C may include repeating units represented by the following Chemical Formulas 10 to 12, the repeating unit represented by Chemical Formula 2 may include repeating units represented by the following Chemical Formulas 13 and 14, and the repeating unit represented by Chemical Formula 4 may include repeating units represented by the following Chemical Formulas 15 to 17, but are not limited thereto.

Chemical Formula 7

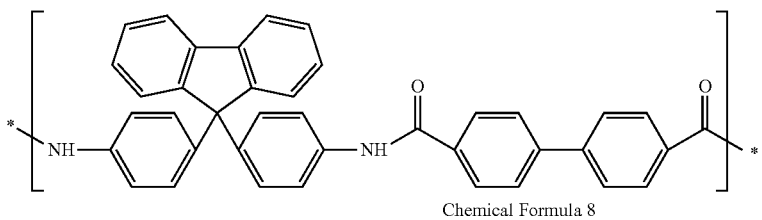

Chemical Formula 8

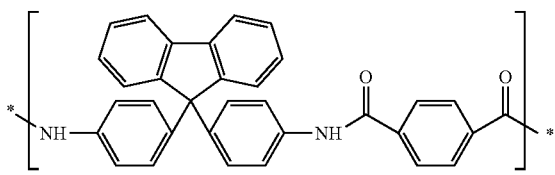

Chemical Formula 9

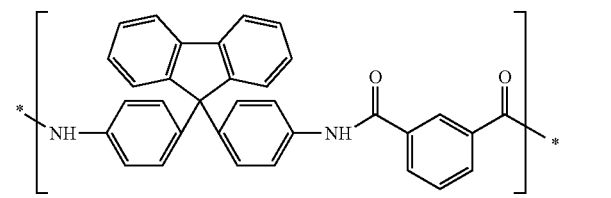

Chemical Formula 10

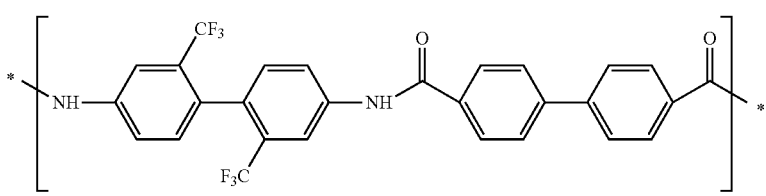

Chemical Formula 11

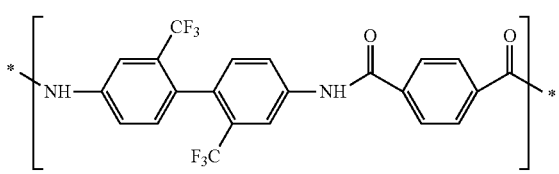

Chemical Formula 12

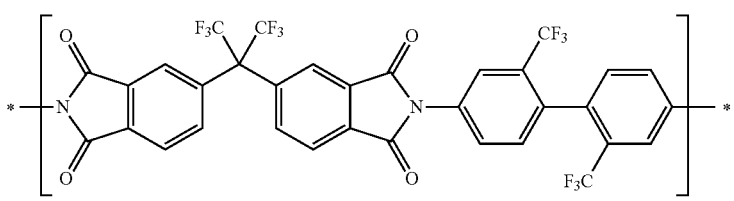

Chemical Formula 13

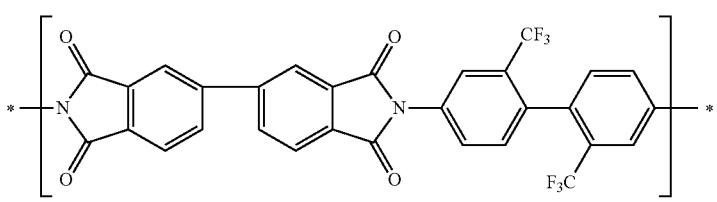

Chemical Formula 14

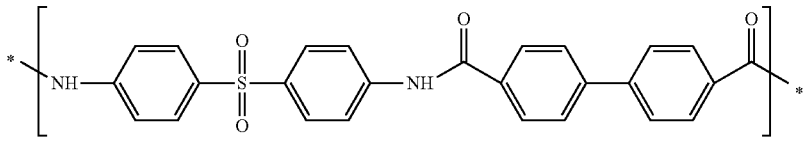

Chemical Formula 15

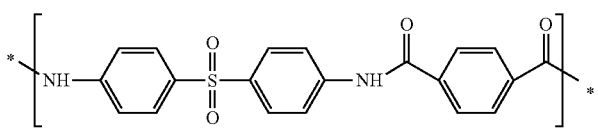

Chemical Formula 16

Chemical Formula 17

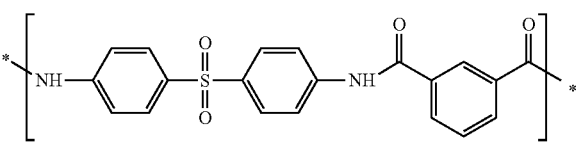

The poly(amide-imide) block copolymer according to an embodiment may provide improved optical properties, for example, transparency, heat resistance, mechanical strength, and flexibility, of an article including the poly(amide-imide) block copolymer, by including the first segment that has excellent solubility in a solvent, workability, and optical properties that may decrease the coefficient of thermal expansion, and the second segment that has excellent heat resistance, mechanical strength and solvent resistance when the article is manufactured, and may suppress the generation of crystals when elongated.

Also, since the poly(amide-imide) block copolymer according to an embodiment exists in the form of a block copolymer, the chemical structure may be easily controlled, and because of this, a low coefficient of thermal expansion ("CTE") may be achieved.

While not wanting to be bound by theory, it is believed that because each monomer of the poly(amide-imide) random copolymer has different reactivity, it is difficult to control the chemical structure, and because of this, the poly(amide-imide) random copolymer has a high coefficient of thermal expansion ("CTE").

Therefore, the poly(amide-imide) block copolymer may be used as a material for diverse articles requiring transparency. For example, the poly(amide-imide) block copolymer may be useful for a variety of applications, such as a substrate for a display device, which includes a substrate for a flexible display device, a touch panel, and a protective film for an optical disk.

According to an embodiment, the poly(amide-imide) block copolymer may have total light transmittance of about 80% or higher in a wavelength range of 380 nanometers (nm) to 750 nm, and may have light transmittance of about 55% or higher for the light of a wavelength of 400 nm. When the light transmittance of the poly(amide-imide) block copolymer is within this range, the poly(amide-imide) block copolymer may be used for manufacturing of articles useful for diverse applications requiring transparency and may have excellent or improved color reproducibility. Particularly, the poly (amide-imide) block copolymer may have total light transmittance of about 80% to about 95% in a wavelength range of 380 nm to 750 nm, and more particularly the poly(amide-imide) block copolymer may have total light transmittance of about 55% to about 90% for the light of a wavelength of 400 nm.

Hereafter, a method for preparing the poly(amide-imide) block copolymer is further disclosed.

The method for preparing the poly(amide-imide) block copolymer includes: providing (e.g., preparing) a precursor of a first segment including the repeating unit represented by Chemical Formula 1A, the repeating unit represented by Chemical Formula 1B, the repeating unit represented by Chemical Formula 1C, or a combination thereof; providing (e.g., preparing) a precursor of a second segment including the repeating unit represented by Chemical Formula 2; copolymerizing the precursor of the first segment and the precursor of the second segment; and imidizing the precursor of the second segment to prepare the poly(amide-imide) block copolymer.

Also disclosed is a method for preparing a poly(amide-imide) block copolymer, the method comprising:

contacting a first diamine and a stoichiometric excess of a first dicarboxylic acid dichloride to prepare first segment precursor;

contacting a tetracarboxylic dianhydride and a second diamine to prepare a second segment precursor;

polymerizing the first segment precursor and the second segment precursor in the presence of a second dicarboxylic acid dichloride to polymerize the first segment precursor and the second segment precursor; and imidizing the polymerized first segment precursor and second segment precursor to prepare the poly(amide-imide) block copolymer.

The first diamine and the second diamine may each independently be 4,4'-(9-fluorenylidene)dianiline, 2,2'-bis(trifluoromethyl)benzidine, 4,4'-diaminodiphenyl sulfone, bis(4-(4-aminophenoxy)phenyl)sulfone, 2,2',5,5'-tetrachlorobenzidine, 2,7-diaminofluorene, 1,1-bis(4-aminophenyl)cyclohexane, 4,4'-methylene-bis(2-methylcyclohexylamine), 4,4-diaminooctafluorobiphenyl, 3,3'-dihydroxybenzidine, 1,3-cyclohexanediamine, or a combination thereof.

The first dicarboxylic acid dichloride and the second dicarboxylic acid dichloride may be the same or different and may be terephthaloyl chloride, isophthaloyl chloride, biphenyl dicarbonyl chloride, naphthalene dicarbonylchloride, terphenyl dicarbonylchloride, 2-fluoro-terephthaloyl chloride, or a combination thereof.

The tetracarboxylic dianhydride may be 2,2-bis(3,4-dicarboxyphenyl)hexafluoropropane dianhydride, 3,3',4,4'-biphenyltetracarboxylic dianhydride, benzophenone tetracarboxylic dianhydride, bis(3,4-dicarboxyphenyl)sulfone dianhydride, or a combination thereof.

Unless otherwise mentioned, the repeating unit represented by Chemical Formula 1A, the repeating unit represented by Chemical Formula 1B, the repeating unit represented by Chemical Formula 1C, the first segment, the repeating unit represented by Chemical Formula 2, the second segment, and the poly(amide-imide) block copolymer are as previously described.

The first segment is an amide block, and it may be prepared using a method such as a low-temperature solution polymerization method, an interface polymerization method, a fusion polymerization method, and a solid-phase polymerization method, but is not limited thereto.

According to an embodiment, a low-temperature solution polymerization method for preparing the first segment is further described. According to the low-temperature solution polymerization method, an amide block is prepared by polymerizing a dicarboxylic acid dichloride and a diamine in an aprotic polar solvent.

The aprotic polar solvent may include a sulfoxide-containing solvent such as dimethylsulfoxide and diethylsulfoxide, a formamide-containing solvent such as N,N-dimethyl formamide and N,N-diethylformamide, an acetamide-containing solvent such as N,N-dimethylacetamide, N,N-dimethylmethoxyacetamide, and N,N-diethylacetamide, a pyrrolidone-containing solvent such as N-methyl-2-pyrrolidone, N-acetyl-2-pyrrolidone, and N-vinyl-2-pyrrolidone, a phenol-containing solvent such as phenol, o-cresol, m-cresol, p-cresol, xylenol, halogenated phenol, and catechol, hexamethylphosphoramide, γ-butyrolactone, tetrahydrothiophene dioxide, N-methyl-δ-caprolactam, N,N,N',N'-tetramethylurea, or a mixture thereof. However, this disclosure is not limited to an aprotic polar solvent, and an aromatic hydrocarbon solvent such as xylene or toluene may be used. Also, to promote the dissolution of a polymer, an alkali metal salt or an alkaline earth metal salt may be further added to the solvent in an amount of about 50 weight percent (wt %) or less based on the total amount of the solvent.

The first segment may be obtained in the aprotic polar solvent by mixing and reacting a diamine such as 4,4'-(9-fluorenylidene)dianiline ("BAPF"), 2,2'-bis(trifluoromethyl) benzidine ("TFDB"), 4,4'-diaminodiphenyl sulfone ("DADPS"), bis(4-(4-aminophenoxy)phenyl)sulfone ("BAPS"), 2,2',5,5'-tetrachlorobenzidine, 2,7-diaminofluorene, 1,1-bis(4-aminophenyl)cyclohexane, 4,4'-methylene-bis(2-methylcyclohexylamine), 4,4-diaminooctafluorobiphenyl, 3,3'-dihydroxybenzidine, 1,3-cyclohexanediamine, or a combination thereof; and a dicarboxylic acid dichloride such as terephthaloyl chloride ("TPCl"), isophthaloyl chloride ("IPCl"), biphenyl dicarbonyl chloride ("BPCl"), naphthalene dicarbonylchloride, terphenyl dicarbonylchloride, 2-fluoro-terephthaloyl chloride, or a combination thereof. According to an embodiment, the kind and amount of the diamine and the dicarboxylic acid dichloride may be selected appropriately according to a desired composition of the first segment.

According to an embodiment, when the first segment is prepared and more diamine is used than the dicarboxylic acid dichloride, an amine group may be present at a terminal end of the first segment.

The second segment is an imide block, and it may be prepared using a general process of first preparing a precursor of the second segment, which is an amic acid block, and then imidizing the precursor of the second segment. For example, the second segment may be prepared by reacting a tetracarboxylic dianhydride as a monomer with a diamine, so as to form an amic acid block, and then imidizing the amic acid block through a process such as a thermal solution imidization or chemical imidization.

The amic acid block that is a precursor of the second segment may be prepared by mixing and reacting a tetracarboxylic dianhydride such as 2,2-bis(3,4-dicarboxyphenyl)hexafluoropropane dianhydride ("6FDA"), 3,3',4,4'-biphenyltetracarboxylic dianhydride ("BPDA"), benzophenone tetracarboxylic dianhydride ("BTDA"), bis(3,4-dicarboxyphenyl)sulfone dianhydride, or a combination thereof; and a diamine such as 2,2'-bis(trifluoromethyl)benzidine ("TFDB"), 4,4'-diaminodiphenyl sulfone ("DADPS"), 4,4'-(9-fluorenylidene)dianiline ("BAPF"), bis(4-(4-aminophenoxy)phenyl)sulfone ("BAPS"), 2,2',5,5'-tetrachlorobenzidine, 2,7-diaminofluorene, 1,1-bis(4-aminophenyl)cyclohexane, 4,4'-methylene-bis(2-methylcyclohexylamine), 4,4-diaminooctafluorobiphenyl, 3,3'-dihydroxybenzidine, 1,3-cyclohexanediamine, or a combination thereof. According to an embodiment, the kind and amount of the tetracarboxylic dianhydride and the diamine may be appropriately selected according to a desired composition of the above-mentioned second segment.

According to an embodiment, when the precursor of the second segment is prepared and more diamine is used than the tetracarboxylic dianhydride, an amine group may be present at a terminal end of the precursor of the second segment.

Subsequently, a poly(amide-amic acid) block copolymer may be prepared by mixing and copolymerizing the first segment including an amine group at both terminal ends and the precursor of the second segment including an amine group at both terminal ends with a dicarboxylic acid dichloride such as terephthaloyl chloride ("TPCl"), isophthaloyl chloride ("IPCl"), biphenyl dicarbonylchloride, naphthalene dicarbonylchloride, terphenyl dicarbonylchloride, 2-fluoro-terephthaloyl chloride, or a combination thereof. Subsequently, a poly(amide-imide) block copolymer may be prepared by imidizing the poly(amide-amic acid) block copolymer. According to an embodiment, the kinds and amounts of the first segment, the precursor of the second segment, and the dicarboxylic acid dichloride may be appropriately selected and used according to a desired composition of the above-described poly(amide-imide) block copolymer. According to an embodiment, the copolymerization may be performed using a low-temperature solution polymerization method, and the imidization may be performed using chemical imidization, but this disclosure is not limited thereto.

According to another embodiment, an article including the poly(amide-imide) block copolymer is provided. A method for preparing the article may comprise disposing the poly (amide-imide) block copolymer of claim 1 on a substrate to form a layer; drying the layer; delaminating the layer from the substrate; elongating the layer; and heat treating the layer.

The article may be a film, a fiber, a coating material, or an adhesive material, but is not limited thereto.

The article may be formed from the poly(amide-imide) block copolymer using a dry-wet method, a dry method, or a wet method, but this disclosure is not limited thereto.

According to an embodiment when the article is a film and is manufactured using the poly(amide-imide) block copolymer through the dry-wet method, a layer is formed by extruding the poly(amide-imide) block copolymer from a mouth piece on a supporter, such as drum or an endless belt, drying the layer, and evaporating the solvent out of the layer until the layer has a self maintenance property. The drying may be performed at about 25° C. to about 220° C. for about 1 hour or less. More specifically the drying may be performed at about 25° C. to about 150° C. for about 1 hour or less. When the surface of the drum and/or the endless belt used for the drying process becomes flat, a layer with a flat surface is formed. The layer obtained after the drying process is delaminated from the supporter, and inputted to a wet process, desalted and/or desolventized. The manufacturing of the film is completed as the layer is elongated, dried, and/or heat treated.

The elongating conforms to a draw ratio, which may range from about 0.8 to about 8 in terms of surface ratio. According to an embodiment, it may range from about 1.3 to about 8. As used herein, the term "surface ratio" refers to a value obtained by dividing the area of a layer after the elongating, by an area of the layer before the elongating. A value of 1 or less denotes a relaxed state. According to an embodiment, the elongating may be performed not only in a surface direction but also in a thickness direction.

The heat treatment may be performed at a temperature of about 200° C. to about 500° C., particularly at about 250° C. to about 400° C., for about 1 second to a about 100 minutes, specifically about 1 to about 10 minutes.

Also, the layer after elongating and heat treatment may be cooled slowly, particularly at a speed of about 50° C./second or lower.

The layer may be formed as a single layer or as multiple layers.

An article including the poly(amide-imide) block copolymer may have a total light transmittance of about 80% or higher at a wavelength range of about 380 nm to about 750 nm, and may have light transmittance of about 55% or higher at a wavelength of about 400 nm. When the light transmittance of the article including the poly(amide-imide) block copolymer is within this range, the article including the poly (amide-imide) block copolymer may have excellent or improved color reproducibility. Particularly, the article including the poly(amide-imide) block copolymer may have a total light transmittance of about 80% to about 95% in a wavelength range of 380 nm to 750 nm, and may have a light transmittance of about 55% to about 90% at a wavelength of about 400 nm.

The article including the poly(amide-imide) block copolymer may have a coefficient of thermal expansion ("CTE") of about 35 parts per million per degree Celsius ("ppm/° C.") or less. When the coefficient of thermal expansion of the article is within the range, the article may have excellent or improved heat resistance. Particularly, the article may have a coefficient of thermal expansion of about 25 ppm/° C. or less, more particularly about 20 ppm/° C. or less, still more particularly about 15 ppm/° C. or less. Even more particularly, the article may have a coefficient of thermal expansion of about 0.5 ppm/° C. to about 15 ppm/° C.

The article including the poly(amide-imide) block copolymer may have haze of about 3% or less. When the haze of the article is within the range, the article may be transparent enough to have excellent or improved clarity. Particularly, the article may have haze of about 1.5% or less, more particularly about 1.0% or less, and still more particularly the article may have haze of about 0.1% to about 1.0%.

The article including the poly(amide-imide) block copolymer may have a yellowness index ("YI") of about 3% or less. When the yellowness index ("YI") of the article is within this range, the article may be transparent and colorless. Particularly, the article may have a yellowness index ("YI") of about 0.5% to about 3%, more particularly the article may have a yellowness index of about 1.5% to about 3%.

The article including the poly(amide-imide) block copolymer, for example a film, may have a thickness of about 0.01 micrometers (μm) to about 1000 μm, but the disclosure is not limited to this and the thickness may be adjusted according to the usage. Particularly the article may have a thickness of about 10 μm to about 800 μm, and more particularly about 25 μm to about 100 μm.

According to an embodiment the article includes the poly (amide-imide) block copolymer which has excellent or improved transparency, heat resistance, mechanical strength, and flexibility, and thus the article may have excellent or improved transparency, heat resistance, mechanical strength, and flexibility as well. Therefore, the article may be used for diverse applications, such as a substrate for a device, a substrate for a display device, an optical film, an integrated circuit ("IC") package, an adhesive film, a multi-layer flexible printed circuit ("FPC"), a tape, a touch panel, or a protective film for an optical disk.

According to another embodiment a display device is provided including the article. The display device may be a liquid crystal display ("LCD"), an organic light emitting diode ("OLED"), and the like, but is not limited thereto.

According to an embodiment a display device, such as a liquid crystal display ("LCD") is described by referring to FIG. 1.

FIG. 1 is a cross-sectional view of an embodiment of a liquid crystal display ("LCD").

Referring to FIG. 1, the liquid crystal display ("LCD") includes a thin film transistor array panel 100, a common electrode panel 200 facing the thin film transistor array panel 100, and a liquid crystal layer 3 interposed between the two panels 100 and 200.

First, the thin film transistor array panel 100 will be further described.

A gate electrode 124, a gate insulating layer 140, a semiconductor 154, a plurality of ohmic contacts 163 and 165, a source electrode 173 and a drain electrode 175 are sequentially disposed on a substrate 110. The source electrode 173 and the drain electrode 175 are isolated from each other and they face each other with the gate electrode 124 disposed between them.

A first gate electrode 124, a first source electrode 173, and a first drain electrode 175 constitute one thin film transistor ("TFT") together with the semiconductor 154A channel of the thin film transistor is formed in the semiconductor 154 disposed between the source electrode 173 and the drain electrode 175.

A protective layer 180 is disposed on the gate insulating layer 140, the source electrode 173, and the drain electrode 175, and a contact hole 185 that exposes the drain electrode 175 is formed in the protective layer 180.

A pixel electrode 191 formed of a transparent conductive material such as indium tin oxide ("ITO") or indium zinc oxide ("IZO") is disposed on the protective layer 180. The pixel electrode 191 is connected to the drain electrode 175 through the contact hole 185.

The common electrode panel 200 will now be further described.

In the common electrode panel 200, a light blocking member 220 referred to as a black matrix is disposed on a substrate 210, a color filter 230 is disposed on the substrate 210 and the light blocking member 220, and a common electrode 270 is disposed on the color filter 230.

According to an embodiment, the substrates 110 and 210 may be articles including the poly(amide-imide) block copolymer.

Figure 2:
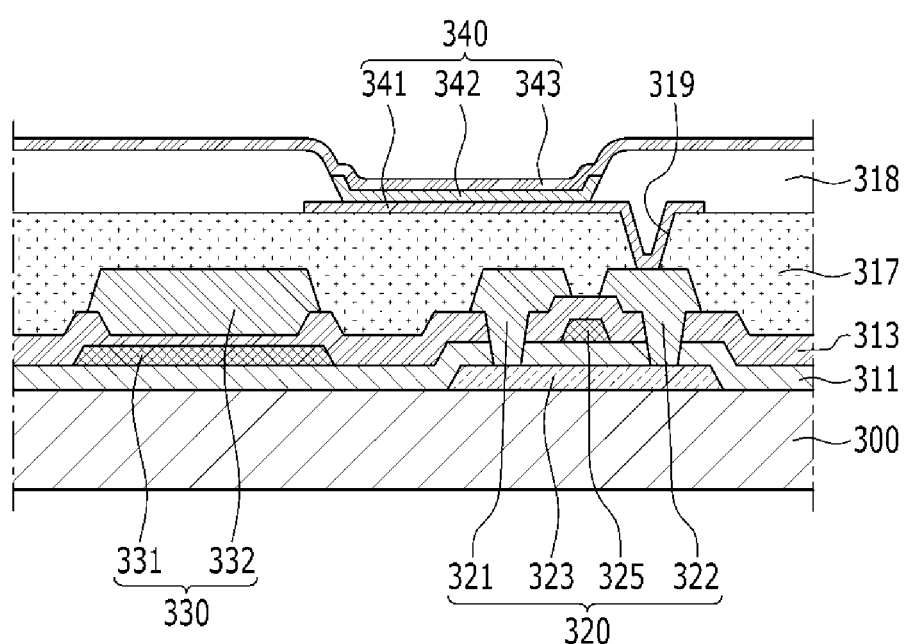
FIG. 2 is a cross-sectional view of an embodiment of an organic light emitting diode ("OLED").

According to another embodiment display devices, such as an organic light emitting diode ("OLED") is described by referring to FIG. 2.

FIG. 2 is a cross-sectional view of an embodiment of an organic light emitting diode ("OLED").

Referring to FIG. 2, a thin film transistor 320, a capacitor 330 and an organic light emitting element 340 are disposed on a substrate 300. The thin film transistor 320 includes a source electrode 321, a semiconductor layer 323, a gate electrode 325, and a drain electrode 322, and the capacitor 330 includes a first capacitor 331 and a second capacitor 332. The organic light emitting element 340 includes a pixel electrode 341, an intermediate layer 342, and an opposed electrode 343.

According to an embodiment, the semiconductor layer 323, a gate insulating layer 311, the first capacitor 331, the gate electrode 325, an interlayer insulating layer 313, the second capacitor 332, the source electrode 321, and the drain electrode 322 are disposed on the substrate 300. The source electrode 321 and the drain electrode 322 are isolated from each other, and they face each other with the gate electrode 325 disposed between them.

A planarization layer 317 is disposed on the interlayer insulating layer 313, the second capacitor 332, the source electrode 321, and the drain electrode 322, and the planarization layer 317 includes a contact hole 319 that exposes the drain electrode 322.

The pixel electrode 341, formed of a transparent conductive material such as ITO or IZO, is disposed on the planarization layer 317. The pixel electrode 341 is connected to the drain electrode 322 through the contact hole 319.

The intermediate layer 342 and the opposed electrode 343 are sequentially disposed on the pixel electrode 341.

A pixel defining layer 318 is disposed in a portion of the planarization layer 317 where the pixel electrode 341, the intermediate layer 342, and the opposed electrode 343 are not disposed on the planarization layer 317.

According to an embodiment, the substrate 300 may be an article including the poly(amide-imide) block copolymer.

EXAMPLES

Hereafter, the embodiments are illustrated in more detail with reference to examples and comparative examples. The following examples and comparative examples are for illustrative purposes only and are not intended to limit the scope of the one or more embodiments.

Synthesis Example 1

Synthesis of a First Segment

A first segment is prepared by reacting about 0.0072 moles (mol) of 4,4'-diaminodiphenyl sulfone ("DADPS"), about 0.0036 mol of 2,2'-bis(trifluoromethyl)benzidine ("TFDB"), and about 0.0054 mol of biphenyl dicarbonyl chloride ("BPCl") in a 500 milliliter (mL) round-bottomed flask in the presence of N,N-dimethyl acetamide ("DMAC") at about 5° C. for about 1 hour. The prepared first segment has a weight average molecular weight of about 9400 grams per mole (g/mol).

Synthesis Examples 2 to 14

Synthesis of a First Segment

A first segment is prepared according to the same method as described in Synthesis Example 1, except that the kind and amount of a diamine and a dicarboxylic acid dichloride are changed according to the following Table 1.

TABLE 1

| | Diamine (mol) | | | | Dicarboxylic acid Dichloride (mol) | | | Weight average molecular weight (g/mol) |
|---|---|---|---|---|---|---|---|---|
| | DADPS | BAPF | TFDB | BAPS | BPCl | IPCl | TPCl | |
| Synthesis Example 1 | 0.0072 | — | 0.0036 | — | 0.0054 | — | — | 9400 |
| Synthesis Example 2 | 0.0084 | — | 0.0012 | — | 0.0048 | — | — | 12300 |
| Synthesis Example 3 | 0.0072 | 0.0012 | 0.0024 | — | 0.0054 | — | — | 10500 |
| Synthesis Example 4 | 0.0084 | 0.0012 | — | — | 0.0048 | — | — | 21700 |
| Synthesis Example 5 | 0.009 | — | 0.003 | — | — | 0.006 | — | 14600 |
| Synthesis Example 6 | 0.006 | — | 0.003 | 0.003 | — | 0.006 | — | 13600 |
| Synthesis Example 7 | 0.009 | — | 0.0015 | 0.0015 | — | 0.006 | — | 11300 |
| Synthesis Example 8 | 0.0168 | — | 0.0036 | — | 0.0102 | — | — | 15200 |
| Synthesis Example 9 | 0.0168 | — | 0.00432 | — | 0.01056 | — | — | 18300 |
| Synthesis Example 10 | 0.0168 | — | 0.0024 | — | 0.0048 | — | 0.0048 | 19500 |
| Synthesis Example 11 | 0.0192 | — | 0.0024 | — | 0.0054 | — | 0.0054 | 17800 |
| Synthesis Example 12 | 0.0072 | — | — | 0.0036 | 0.0054 | — | — | 16100 |
| Synthesis Example 13 | 0.006 | — | — | 0.0036 | — | 0.0048 | — | 22300 |
| Synthesis Example 14 | 0.0096 | — | — | — | — | 0.0048 | — | 18450 |

Synthesis Example 15

Synthesis of a Precursor of a Second Segment

A precursor of a second segment is prepared by reacting about 0.0008 mol of 2,2-bis(3,4-dicarboxyphenyl)hexafluoropropane dianhydride ("6FDA") and about 0.0012 mol of 2,2'-bis(trifluoromethyl)benzidine ("TFDB") in a 500 mL round-bottomed flask in the presence of N,N-dimethyl acetamide ("DMAC") at about 5° C. for about 1 hour. The prepared precursor of the second segment has a weight average molecular weight of about 14,600 g/mol.

Synthesis Example 16 to 22

Synthesis of a Precursor of a Second Segment

A precursor of the second segment is prepared according to the same method as described in Synthesis Example 15, except that the kind and amount of a diamine and a tetracarboxylic dianhydride are changed according to the following Table 2.

TABLE 2

| | Diamine (mol) | | Tetracarboxylic Dianhydride (mol) | | Weight average molecular weight (g/mol) |
|---|---|---|---|---|---|
| | DADPS | TFDB | 6FDA | BPDA | |
| Synthesis Example 15 | — | 0.0012 | 0.0008 | — | 14600 |
| Synthesis Example 16 | — | 0.0024 | 0.0016 | — | 23500 |
| Synthesis Example 17 | 0.003 | — | — | 0.002 | 19700 |
| Synthesis Example 18 | 0.0048 | — | 0.0032 | — | 18100 |
| Synthesis Example 19 | 0.0024 | 0.0012 | 0.0008 | 0.0016 | 23300 |
| Synthesis Example 20 | 0.0024 | 0.0048 | 0.0032 | 0.0016 | 21700 |
| Synthesis Example 21 | 0.0012 | 0.0012 | 0.0008 | 0.0008 | 25900 |
| Synthesis Example 22 | 0.0024 | 0.0024 | 0.0016 | 0.0016 | 19050 |

Example 1

Preparation of a Poly(Amide-Imide) Block Copolymer and a Film

A poly(amide-imide) block copolymer is prepared by mixing the first segment prepared according to Synthesis Example 1, which includes an amine group at both terminal ends, and the precursor of the second segment prepared according to Synthesis Example 15, which includes an amine group at both terminal ends, and adding about 0.0052 mol of isophthaloyl chloride ("IPCl") and about 0.0006 mol of biphenyl dicarbonyl chloride ("BPCl") to the mixture. A copolymerization reaction is performed at about 5° C. for about 1 hour. A chemical imidization reaction is then performed, adding about 0.0016 mol of acetic anhydride and about 0.0016 mol of pyridine to the mixture, and agitating the solution at about 25° C. for about 12 hours, providing a poly(amide-imide) block copolymer.

A film is prepared by coating a glass substrate with the poly(amide-imide) block copolymer, and drying the coated glass substrate at a temperature of about 65° C., about 70° C., and about 75° C. for about 20 minutes, respectively at each temperature, and then drying the coated glass substrate at a temperature of about 80° C., and about 130° C. for about 30 minutes, respectively at each temperature. The prepared film is elongated in one direction at about 280° C., at a speed of about 1%/second until the film is whitened. The elongated film is annealed in an atmosphere of nitrogen at about 320° C. for about 7 minutes to provide a film including a poly(amide-imide) block copolymer. The prepared film has a thickness of about 55 μm.

Examples 2 to 9

Preparation of a Poly(Amide-Imide) Block Copolymer and a Film

A poly(amide-imide) block copolymer and a film are prepared according to the same method as described in Example 1, except that the kind and amount of the first segment and the precursor of the second segment are changed according to the following Table 3.

Comparative Example 1

Preparation of a Poly(Amide-Imide) Block Copolymer and a Film

A poly(amide-imide) block copolymer and a film are prepared according to the same method as described in Example 1, except that the type and amount of the first segment and the precursor of the second segment are changed according to the following Table 3.

Comparative Example 2

Preparation of a Polyimide and a Film

A polyimide is prepared by mixing and reacting about 1 mol of 2,2-bis(3,4-dicarboxyphenyl)hexafluoropropane dianhydride ("6FDA"), about 3 mol of 3,3',4,4'-biphenyltetracarboxylic dianhydride ("BPDA"), and about 4 mol of 2,2'-bis(trifluoromethyl)benzidine ("TFDB") in a 500 mL round-bottomed flask in the presence of N,N-dimethyl acetamide ("DMAC") at about 5° C. for about 1 hour. A chemical imidization reaction is then performed, adding about 8 mol of acetic anhydride and about 8 mol of pyridine to the mixture, and agitating the solution at about 25° C. for about 12 hours, providing a polyimide.

A film is prepared by coating a glass substrate with the polyimide, and drying the coated glass substrate at a temperature of about 65° C., about 70° C., and about 75° C. for about 20 minutes respectively at each temperature, and then drying the coated glass substrate at about 80° C. and about 130° C. for about 30 minutes respectively at each temperature. The prepared film is elongated in one direction at about 280° C. at a speed of about 1%/second until the film is whitened. The elongated film is annealed in a nitrogen atmosphere at about 320° C. for about 7 minutes to provide a film including a polyimide. The prepared film has a thickness of about 50 μm.

TABLE 3

| | First segment | Precursor of second segment | TPCl (mol) | IPCl (mol) | BPCl (mol) | Film thickness (μm) |
|---|---|---|---|---|---|---|
| Example 1 | Synthesis Example 1 | Synthesis Example 15 | — | 0.0052 | 0.0006 | 55 |
| Example 2 | Synthesis Example 2 | Synthesis Example 16 | 0.0044 | — | 0.0012 | 48 |
| Example 3 | Synthesis Example 3 | Synthesis Example 15 | 0.0058 | — | — | 50 |
| Example 4 | Synthesis Example 4 | Synthesis Example 16 | 0.0056 | — | 0.0084 | 60 |
| Example 5 | Synthesis Example 5 | Synthesis Example 17 | 0.0065 | 0.0005 | — | 60 |
| Example 6 | Synthesis Example 8 | Synthesis Example 19 | 0.0114 | — | — | 45 |
| Example 7 | Synthesis Example 9 | Synthesis Example 20 | 0.01152 | — | — | 50 |
| Example 8 | Synthesis Example 10 | Synthesis Example 22 | 0.0112 | — | — | 55 |
| Example 9 | Synthesis Example 11 | Synthesis Example 21 | 0.0116 | — | — | 50 |
| Comparative Example 1 | Synthesis Example 14 | Synthesis Example 16 | 0.0052 | 0.0004 | — | 65 |

Experimental Example 1

Coefficient of Thermal Expansion

The coefficients of thermal expansion ("CTE") of the films prepared according to Examples 1 to 9 and Comparative Example 2 are measured through thermo-mechanical analysis using a thermo-mechanical analyzer ("TMA") (about 5 degrees Celsius per minute ("° C./min"), pre-load: about 10 milliNewton (mN), TA Instruments TMA 2940). The measured coefficients of thermal expansion ("CTE") are presented in the following Table 4.

Experimental Example 2

Optical Properties

The light transmittance, haze, and yellowness index ("YI") of the films prepared according to Examples 1 to 9 and Comparative Example 2 are measured with a KONICA MINOLTA spectrophotometer to evaluate the optical properties of the films prepared according to Examples 1 to 9 and Comparative Example 2. The results are presented in the following Table 4.

TABLE 4

| | Coefficient of thermal expansion (CTE) (ppm/°C.) | Total light transmittance (%, 380 nm to 750 nm) | Light transmittance (%, 400 nm) | Haze (%) | Yellow index (%) |
|---|---|---|---|---|---|
| Example 1 | 12.2 | 86.86 | 79.02 | 0.69 | 2.39 |
| Example 2 | 0.7 | 86.98 | 77.93 | 0.83 | 2.13 |
| Example 3 | 1.9 | 86.66 | 70.2 | 0.73 | 2.65 |
| Example 4 | 11.7 | 87.13 | 68.98 | 0.81 | 2.3 |
| Example 5 | 24.57 | 86.6 | 56.24 | 0.62 | 2.35 |
| Example 6 | 3.191 | 86.19 | 70.62 | 0.7 | 2.38 |
| Example 7 | 5.221 | 86.23 | 69 | 0.54 | 2.29 |
| Example 8 | 12.9 | 86.58 | 67.92 | 1.33 | 2.13 |
| Example 9 | 13.65 | 86.43 | 74.66 | 0.73 | 2.02 |
| Comparative Example 2 | 29 | 87 | 32 | 0.6 | 1.2 |

It may be seen from Table 4 that the films prepared according to Examples 1 to 9 have a coefficient of thermal expansion of about 25 ppm/° C. or lower, have total light transmittance of about 80% or higher in a range of about 380 nm to about 750 nm, have light transmittance of about 55% or higher at about 400 nm, have haze of about 1.5% or lower, have a yellowness index of about 3% or lower, and have excellent heat resistance and optical properties.

While the total light transmittance in a range of about 380 nm to about 750 nm, haze, and yellowness index of the film prepared according to Comparative Example 2 are as good as the total light transmittance in a range of about 380 nm to about 750 nm, haze, and yellowness index of the films prepared according to Examples 1 to 9, the film prepared according to Comparative Example 2 has a high coefficient of thermal expansion and low light transmittance at about 400 nm.

While this disclosure has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

What is claimed is:

1. A poly(amide-imide) block copolymer, comprising:
  a first segment comprising a structural unit represented by the following Chemical Formula 1B, a structural unit represented by the following Chemical Formula 1C, or a combination thereof,

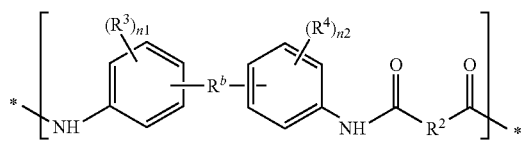

Chemical Formula 1B wherein, in Chemical Formula 1B, $R^b$ is selected from the group consisting of

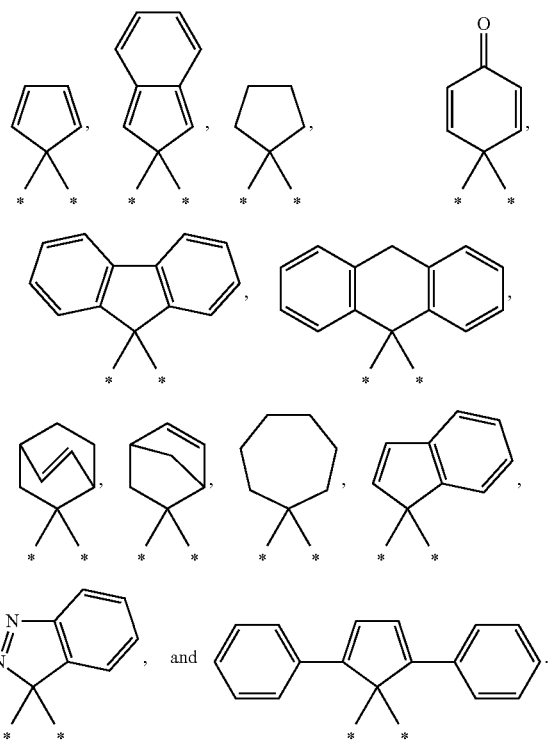

$R^2$ is selected from the group consisting of:

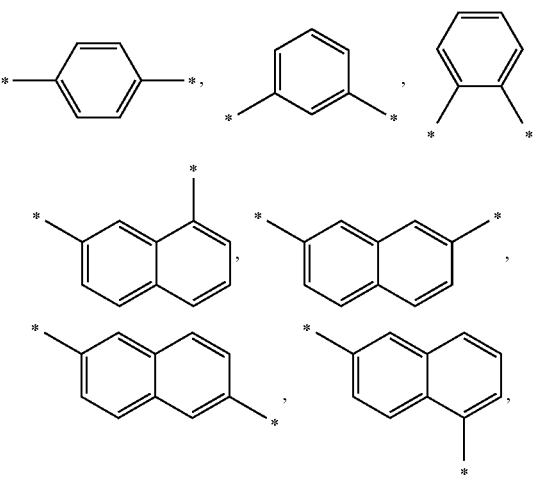

-continued

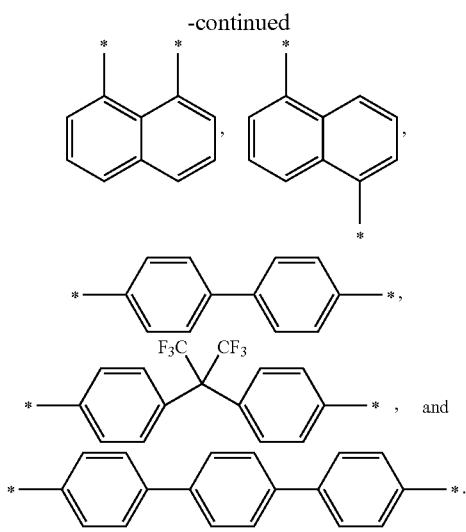

$R^3$ and $R^4$ are the same or different and are each independently a halogen, a hydroxyl group, an alkoxy group of the formula —$OR^{200}$ wherein $R^{200}$ is a C1 to C10 aliphatic organic group, a silyl group of the formula —$SiR^{201}R^{202}R^{203}$ wherein $R^{201}$, $R^{202}$, and $R^{203}$ are the same or different and are each independently hydrogen or a C1 to C10 aliphatic organic group, a C1 to C10 aliphatic organic group, or a C6 to C20 aromatic organic group, and n1 and n2 are each independently an integer ranging from 0 to 4, Chemical Formula 1C

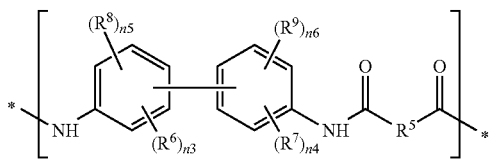

wherein, in Chemical Formula 1C, $R^5$ is the same as $R^2$ as defined above, $R^6$ and $R^7$ are each a C1 to C2 haloalkyl group, $R^8$ and $R^9$ are the same or different and are each independently a halogen, a hydroxyl group, an alkoxy group of the formula —$OR^{204}$ wherein $R^{204}$ is a C1 to C10 aliphatic organic group, a silyl group of the formula —$SiR^{205}R^{206}R^{207}$ wherein $R^{205}$, $R^{206}$, and $R^{207}$ are the same or different and are each independently hydrogen or a C1 to C10 aliphatic organic group, a C1 to C10 aliphatic organic group, or a C6 to C20 aromatic organic group, n3 is an integer ranging from 1 to 4, n5 is an integer ranging from 0 to 3, and the sum of n3 and n5 is an integer ranging from 1 to 4, and n4 is an integer ranging from 1 to 4, n6 is an integer ranging from 0 to 3, and the sum of n4 and n6 is an integer ranging from 1 to 4; and a second segment including a structural unit represented by the following Chemical Formula 5, Chemical Formula 5

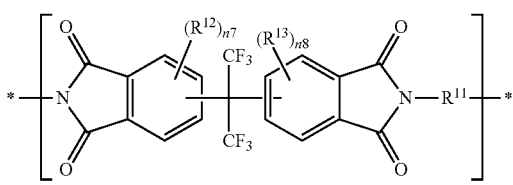

wherein, in Chemical Formula 5, $R^{11}$ is a C3 to C30 aliphatic organic group, a C3 to C30 alicyclic organic group, a substituted or unsubstituted C6 to C30 aromatic organic group wherein the aromatic organic group is present singularly or at least two are linked to provide a condensed cycle or at least two are linked by a single bond, or by a functional group selected from the group consisting of a C13 to C20 fluorenylene group, —C(=O)—, —S(=O)$_2$—, —Si(CH$_3$)$_2$—, —(CF$_2$)$_q$— wherein 1≤q≤10, —C(CH$_3$)$_2$—, —C(CF$_3$)$_2$—, and —C(=O)NH—, and wherein the substituted C6 to C30 aromatic organic group is substituted with an electron withdrawing group selected from the group consisting of a halogen atom, nitro group, cyano group, C1 to C2 haloalkyl group, C1 to C6 alkanoyl group, and C1 to C6 ester group, $R^{12}$ and $R^{13}$ are the same or different and are each independently a halogen, a hydroxyl group, an alkoxy group of the formula —$OR^{208}$ wherein $R^{208}$ is a C1 to C10 aliphatic organic group, a silyl group of the formula —$SiR^{209}R^{210}R^{211}$ wherein $R^{209}$, $R^{210}$, $R^{211}$ are the same or different and are each independently hydrogen or a C1 to C10 aliphatic organic group, a C1 to C10 aliphatic organic group, C3 to C30 alicyclic organic group, or a C6 to C20 aromatic organic group, and n7 and n8 are each independently integers ranging from 0 to 3.

2. The poly(amide-imide) block copolymer of claim 1, wherein the $R^6$ and $R^7$ are the same or different and are each independently —CF$_3$, —CCl$_3$, —CBr$_3$, or —CCl$_3$.

3. The poly(amide-imide) block copolymer of claim 1, wherein $R^{11}$ is a C3 to C30 alkylene group, a C3 to C30 cycloalkylene group, a substituted or unsubstituted C6 to C30 arylene group, wherein the arylene group is present singularly or at least two are linked to provide a condensed cycle or at least two are linked by a single bond, or by a functional group selected from the group consisting of a C13 to C20 fluorenylene group, —C(=O)—, —S(=O)$_2$—, —Si(CH$_3$)$_2$—, —(CF$_2$)$_q$— wherein 1≤q ≤10, —C(CH$_3$)$_2$—, —C(CF$_3$)$_2$—, and —C(=O) NH—, and wherein the substituted C6 to C30 aromatic organic group is substituted with an electron withdrawing group selected from the group consisting of a halogen atom, nitro group, cyano group, C1 to C2 haloalkyl group, C1 to C6 alkanoyl group, and C1 to C6 ester group, $R^{12}$ and $R^{13}$ are the same or different and are each independently a halogen, a hydroxyl group, a C1 to C10 alkyl group a C1 to C10 cycloalkyl group, or a C6 to C20 aryl group, and n7 and n8 are each independently integers ranging from 0 to 3.

4. The poly(amide-imide) block copolymer of claim 1, wherein the poly(amide-imide) block copolymer comprises about 1 to about 1000 structural units of the structural unit represented by Chemical Formula 1B, the structural unit represented by Chemical Formula 1C, or a combination thereof.

5. The poly(amide-imide) block copolymer of claim 1, wherein the first segment has a weight average molecular weight of about 500 g/mol to about 50,000 g/mol.

6. The poly(amide-imide) block copolymer of claim 1, wherein the first segment further comprises a structural unit represented by the following Chemical Formula 4:

Chemical Formula 4

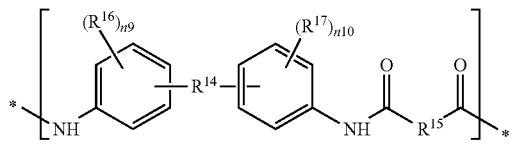

wherein, in Chemical Formula 4,
$R^{14}$ is —O—, —S—, —C(=O)—, —CH(OH)—, —S(=O)$_2$—, —Si(CH$_3$)$_2$—, —(CH$_2$)$_p$— wherein $1 \leq p \leq 10$, —(CF$_2$)$_q$— wherein $1 \leq q \leq 10$, —C(CH$_3$)$_2$—, —C(CF$_3$)$_2$—, or —C(=O)NH—,
$R^{15}$ is

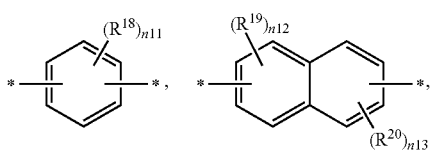

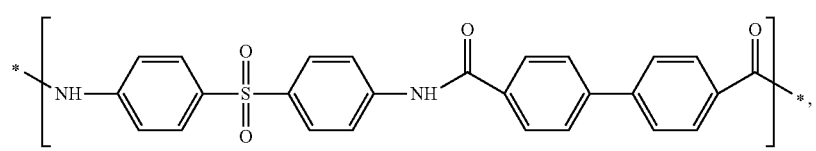

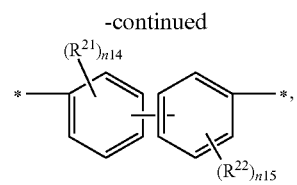

-continued

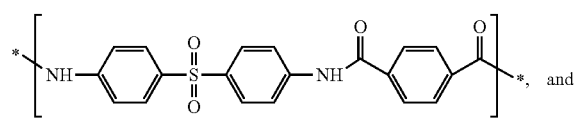, or

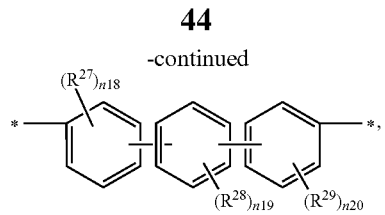

wherein in the above chemical formulas,
$R^{18}$ to $R^{29}$ are the same or different and are each independently a deuterium, a halogen, a C1-C10 aliphatic organic group, or a C6-C20 aromatic organic group, n11 and n14 to n20 are each independently an integer ranging from 0 to 4, and n12 and n13 are each independently an integer ranging from 0 to 3,
$R^{16}$ and $R^{17}$ are the same or different and are each independently a halogen, a hydroxyl group, an alkoxy group of the formula —OR$^{212}$ wherein R$^{212}$ is a C1 to C10 aliphatic organic group, a silyl group of the formula —SiR$^{213}$R$^{214}$R$^{215}$ wherein R$^{213}$, R$^{214}$, and R$^{215}$ are the same or different and are each independently hydrogen or a C1 to C10 aliphatic organic group, a C1 to C10 aliphatic organic group, or a C6 to C20 aromatic organic group, and
n9 and n10 are each independently integers ranging from 0 to 4.

7. The poly(amide-imide) block copolymer of claim 6, wherein
$R^{14}$ is —O—, —S—, —S(=O)$_2$—, or —C(=O)—, and
$R^{16}$ and $R^{17}$ are each independently a halogen, a hydroxyl group, a C1 to C10 alkyl group, or a C6 to C10 aryl group.

8. The poly(amide-imide) block copolymer of claim 6, wherein the structural unit represented by Chemical Formula 4 is represented by any one of the following Chemical Formulas 15 to 17:

Chemical Formula 15

Chemical Formula 16

Chemical Formula 17

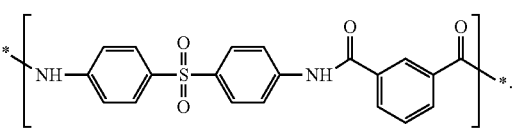

9. The poly(amide-imide) block copolymer of claim 1, wherein the poly(amide-imide) block copolymer comprises about 1 to about 1000 structural units of the structural unit represented by Chemical Formula 5.

10. The poly(amide-imide) block copolymer of claim 1, wherein the second segment has a weight average molecular weight of about 500 g/mol to about 50,000 g/mol.

11. The poly(amide-imide) block copolymer of claim 1, wherein total moles of the structural unit of the first segment and total moles of the structural units of the second segment are present at a mole ratio of about 95:5 to about 5:95.

12. The poly(amide-imide) block copolymer of claim 1, wherein the second segment further comprises a structural unit represented by the following Chemical Formula 6:

Chemical Formula 6

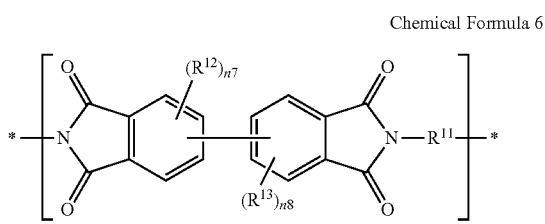

wherein, in Chemical Formula 6,
- $R^{11}$ is a C6 to C30 aliphatic organic group, a C3 to C30 alicyclic organic group, a substituted or unsubstituted C6 to C30 aromatic organic group wherein the aromatic organic group is present singularly or at least two are linked to provide a condensed cycle or at least two are linked by a single bond, or by a functional group selected from the group consisting of a C13 to C20 fluorenylene group, —C(=O)—, —S(=O)$_2$—, —Si(CH$_3$)$_2$—, —(CF$_2$)$_q$— wherein $1 \leq q \leq 10$, —C(CH$_3$)$_2$—, —C(CF$_3$)$_2$—, and —C(=O)NH—, and wherein the substituted C6 to C30 aromatic organic group is substituted with an electron withdrawing group selected from the group consisting of a halogen atom, nitro group, cyano group, C1 to C2 haloalkyl group, C1 to C6 alkanoyl group, and C1 to C6 ester group,
- $R^{12}$ and $R^{13}$ are the same or different and are each independently a halogen, a hydroxyl group, an alkoxy group of the formula —OR$^{208}$, wherein R$^{208}$ is a C1 to C10 aliphatic organic group, a silyl group of the formula —SiR$^{209}$R$^{210}$R$^{211}$ wherein R$^{209}$, R$^{210}$, and R$^{211}$ are the same or different and are each independently hydrogen or a C1 to C10 aliphatic organic group, a C1 to C10 aliphatic organic group, or a C6 to C20 aromatic organic group, and
- n7 and n8 are each independently integers ranging from 0 to 3.

13. The poly(amide-imide) block copolymer of claim 12, wherein the mole ratio of total moles of the first segment to total moles of the second segment is about 95:5 to about 5:95.

14. The poly(amide-imide) block copolymer of claim 12, wherein the structural units represented by Chemical Formulas 5 and 6 are present at a mole ratio of about 99:1 to about 1:99.

15. The poly(amide-imide) block copolymer of claim 12,
  wherein the first segment comprises a structural unit represented by Chemical Formula 1C, wherein the structural unit represented by Chemical Formula 1C is represented by any one of the following Chemical Formulas 10 to 12,
  wherein the structural unit represented by Chemical Formula 5 is represented by the following Chemical Formula 13, and
  wherein the structural unit represented by Chemical Formula 6 is represented by the following Chemical Formula 14:

Chemical Formula 10

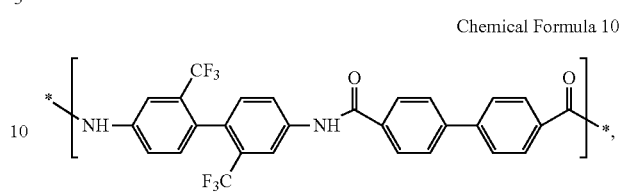

Chemical Formula 11

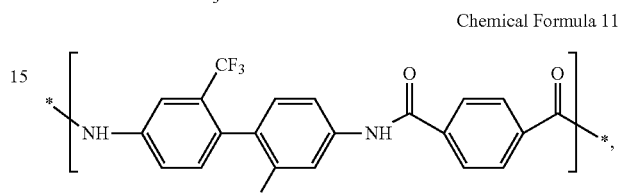

Chemical Formula 12

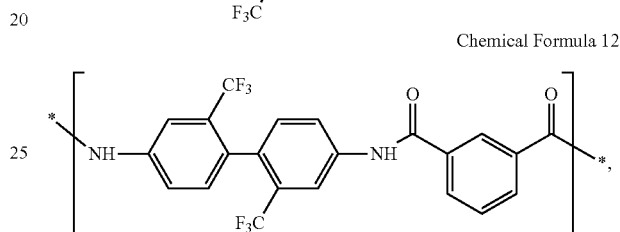

Chemical Formula 13

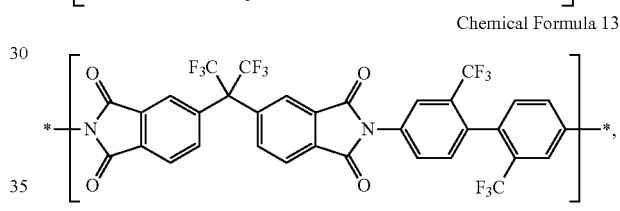

and

Chemical Formula 14

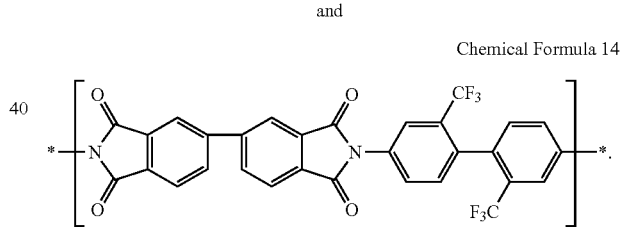

16. The poly(amide-imide) block copolymer of claim 1, wherein the structural unit represented by Chemical Formula 1B is represented by any one of the following Chemical Formulas 7 to 9,
  the structural unit represented by Chemical Formula 1C is represented by any one of the following Chemical Formulas 10 to 12, and
  the structural unit represented by Chemical Formula 5 is represented by the following Chemical Formula 13:

Chemical Formula 7

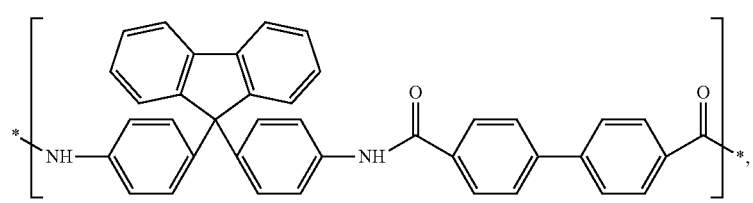

-continued

Chemical Formula 8

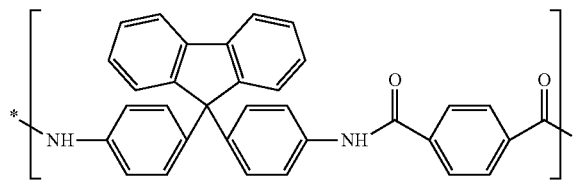

Chemical Formula 9

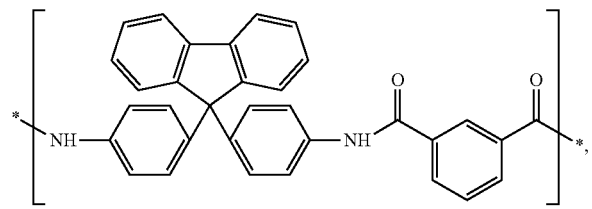

Chemical Formula 10

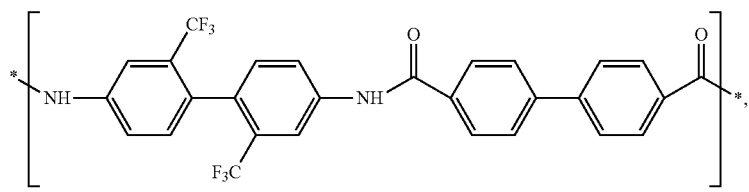

Chemical Formula 11

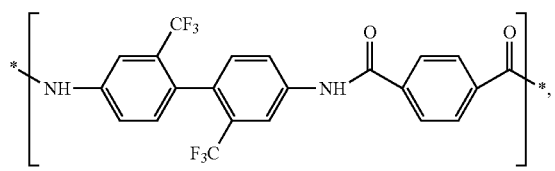

Chemical Formula 12

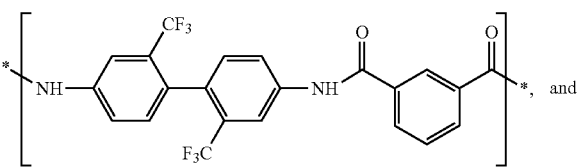, and

Chemical Formula 13

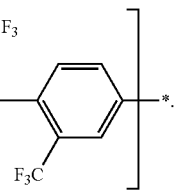

17. An article comprising a poly(amide-imide) block copolymer according to claim 1.

18. The article of claim 17, wherein the article is a film, a fiber, a coating material, or an adhesive.

19. The article of claim 17, wherein the article has a total light transmittance of about 80% or higher in a wavelength range of 380 nm to 750 nm.

20. The article of claim 17, wherein the article has a light transmittance of about 55% or higher at a wavelength of 400 nm.

21. The article of claim 17, wherein the article has a coefficient of thermal expansion of about 35 ppm/° C. or less.

22. The article of claim 17, wherein the article has a haze of about 3% or less.

23. The article of claim 17, wherein the article has a yellowness index of about 3% or less.

24. A display device comprising the article according to claim 17.

25. A method for preparing a poly(amide-imide) block copolymer, the method comprising:
providing a precursor of a first segment;
providing a precursor of a second segment;
copolymerizing the precursor of the first segment and the precursor of the second segment; and
imidizing the precursor of the second segment to prepare the poly(amide-imide) block copolymer, wherein the poly(amide-imide) block copolymer comprises the poly(amide-imide) block copolymer of claim 1.

26. A method for preparing an article, the method comprising
disposing the poly(amide-imide) block copolymer of claim 1 on a substrate to form a layer;
drying the layer;
delaminating the layer from the substrate;
elongating the layer; and
heat treating the layer.

27. The poly(amide-imide) block copolymer of claim 1, wherein the first segment comprises a structural unit represented by Chemical Formula 1C, wherein the structural unit represented by Chemical Formula 1C is represented by any one of the following Chemical Formulas 10 to 12, and
wherein the structural unit represented by Chemical Formula 5 is represented by the following Chemical Formula 13:

Chemical Formula 10

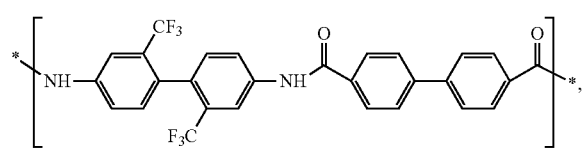

-continued

Chemical Formula 11

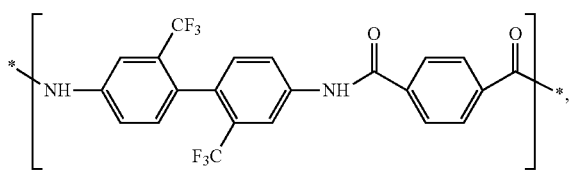

Chemical Formula 12

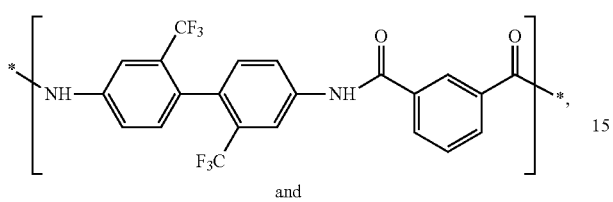

and

Chemical Formula 13

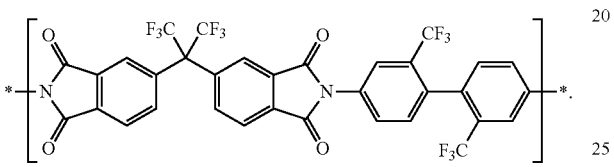

28. A poly(amide-imide) block copolymer, comprising:

a first segment comprising a structural unit represented by Chemical Formula 1C; and a second segment consisting of a structural unit represented by Chemical Formula 2, Chemical Formula 1C

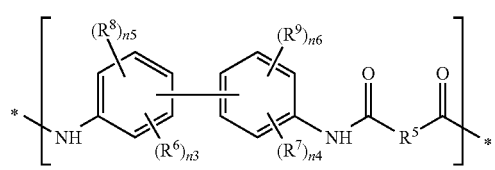

wherein, in Chemical Formula 1C, $R^5$ is selected from the group consisting of:

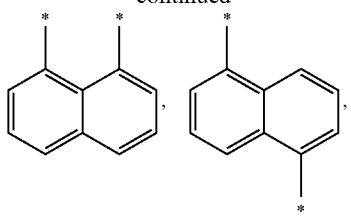

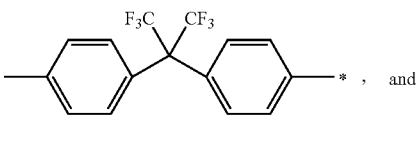

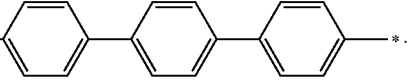

$R^6$ and $R^7$ are each a C1 to C2 haloalkyl group, $R^8$ and $R^9$ are the same or different and are each independently a halogen, a hydroxyl group, an alkoxy group of the formula $-OR^{204}$ wherein $R^{204}$ is a C1 to C10 aliphatic organic group, a silyl group of the formula $-SiR^{205}R^{206}R^{207}$ wherein $R^{205}, R^{206}$, and $R^{207}$ are the same or different and are each independently hydrogen or a C1 to C10 aliphatic organic group, a C1 to C10 aliphatic organic group, or a C6 to C20 aromatic organic group, n3 is an integer ranging from 1 to 4, n5 is an integer ranging from 0 to 3, and the sum of n3 and n5 is an integer ranging from 1 to 4, and n4 is an integer ranging from 1 to 4, n6 is an integer ranging from 0 to 3, and the sum of n4 and n6 is an integer ranging from 1 to 4, Chemical Formula 2

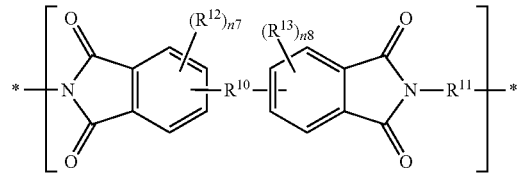

wherein, in Chemical Formula 2, $R^{10}$ is a single bond, a C1 to C30 aliphatic organic group,

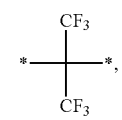

a C3 to C30 alicyclic organic group, a C6 to C30 aromatic organic group, a C2 to C30 heterocyclic group, —O—, —S—, —S(=O)$_2$—, or —C(=O)—, $R^{11}$ is a C3 to C30 aliphatic organic group, a C3 to C30 alicyclic organic group, a substituted or unsubstituted C6 to C30 aromatic organic group wherein the aromatic organic group is present singularly or at least two are linked to provide a condensed cycle or at least two are linked by a single bond, or by a functional group selected from the group consisting of a C13 to C20 fluorenylene group, —C(=O)—, —S(=O)$_2$—, —Si(CH$_3$)$_2$—, —(CF$_2$)$_q$— wherein 1≤q≤10, —C(CH$_3$)$_2$—, —C(CF$_3$)$_2$—, and —C(=O)NH—, and wherein the substituted C6 to C30 aromatic organic group is substituted with an electron withdrawing group selected from the group consisting of a halogen atom, nitro group, cyano group, C1 to C2 haloalkyl group, C1 to C6 alkanoyl group, and C1 to C6 ester group, $R^{12}$ and $R^{13}$ are the same or different and are each independently a halogen, a hydroxyl group, an alkoxy group of the formula —OR$^{208}$ wherein $R^{208}$ is a C1 to C10 aliphatic organic group, a silyl group of the formula —SiR$^{209}$R$^{210}$R$^{211}$ wherein $R^{209}$, $R^{210}$, and $R^{211}$ are the same or different and are each independently hydrogen or a C1 to C10 aliphatic organic group, a C1 to C10 aliphatic organic group, C3 to C30 alicyclic organic group, or a C6 to C20 aromatic organic group, and n7 and n8 are each independently integers ranging from 0 to 3.

29. The poly(amide-imide) block copolymer of claim 28, wherein the structural unit represented by Chemical Formula 2 is a structural unit represented by Chemical Formula 5:

Chemical Formula 5

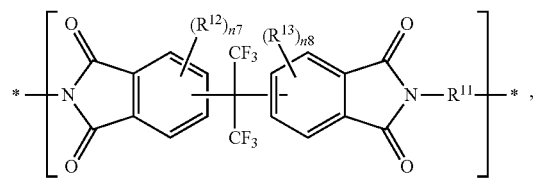

wherein, in Chemical Formula 5, $R^{11}$ is a C3 to C30 aliphatic organic group, a C3 to C30 alicyclic organic group, a substituted or unsubstituted C6 to C30 aromatic organic group wherein the aromatic organic group is present singularly or at least two are linked to provide a condensed cycle or at least two are linked by a single bond, or by a functional group selected from the group consisting of a C13 to C20 fluorenylene group, —C(=O)—, —S(=O)$_2$—, —Si(CH$_3$)$_2$—, —(CF$_2$)$_q$— wherein 1≤q ≤10,—C(CH$_3$)$_2$—, —C(CF$_3$)$_2$—, and —C(=O)NH—, and wherein the substituted C6 to C30 aromatic organic group is substituted with an electron withdrawing group selected from the group consisting of a halogen atom, nitro group, cyano group, C1 to C2 haloalkyl group, C1 to C6 alkanoyl group, and C1 to C6 ester group, $R^{12}$ and $R^{13}$ are the same or different and are each independently a halogen, a hydroxyl group, an alkoxy group of the formula —OR$^{208}$ wherein $R^{208}$ is a C1 to C10 aliphatic organic group, a silyl group of the formula —SiR$^{209}$R$^{210}$R$^{211}$ wherein $R^{209}$,$R^{210}$, and $R^{211}$ are the same or different and are each independently hydrogen or a C1 to C10 aliphatic organic group, a C1 to C10 aliphatic organic group, or a C6 to C20 aromatic organic group, and n7 and n8 are each independently integers ranging from 0 to 3.

* * * * *